United States Patent [19]
Yamaguchi et al.

[11] Patent Number: 5,533,066
[45] Date of Patent: Jul. 2, 1996

[54] APPARATUS AND METHOD FOR ESTIMATING MAXIMUM LIKELIHOOD SEQUENCE USING OPTIMUM SAMPLING PHASE

[75] Inventors: Norio Yamaguchi; Haruhiro Shiino, both of Tokyo, Japan

[73] Assignee: Oki Electric Industry Co., Ltd.

[21] Appl. No.: 190,107

[22] Filed: Feb. 2, 1994

[30] Foreign Application Priority Data

Jun. 18, 1992 [JP] Japan ..................... 4-159475

[51] Int. Cl.[6] .................................. H03D 1/00
[52] U.S. Cl. ................. 375/341; 375/343; 375/348; 371/43
[58] Field of Search ........................ 375/340, 347, 375/343, 341, 342, 346, 348, 350, 229, 230, 231, 232, 349, 233, 262, 285; 370/22; 371/43, 30, 46, 44; 364/724.2; 333/18; 341/51

[56] References Cited

U.S. PATENT DOCUMENTS

| | | | |
|---|---|---|---|
| 3,815,028 | 6/1974 | Rabow ......................... | 375/341 |
| 5,121,414 | 6/1992 | Levine et al. .................. | 375/343 |
| 5,138,632 | 8/1992 | Uchida ......................... | 375/343 |
| 5,263,026 | 11/1993 | Parr et al. ..................... | 370/95.1 |
| 5,271,042 | 12/1993 | Borth et al. ................... | 375/348 |
| 5,444,721 | 8/1995 | Okanoue et al. ............... | 375/341 |

FOREIGN PATENT DOCUMENTS

| | | |
|---|---|---|
| 0544315 | 6/1993 | European Pat. Off. . |
| 2242339 | 9/1991 | United Kingdom . |

OTHER PUBLICATIONS

Joshi et al, "Sequence Estimation Techniques for Digital Subscriber Loop Transmission with Crosstalk Interface", IEEE Trans of Comm. vol. 38 Iss. 9, Sep. 1990 pp. 1367–1374.

Gaudenzi et al, "Analysis of an All–Digital Maximum Likelihood Carrier Phase & Clock Timing Synchronizer for 8 psk Mod", IEEE Trans. on Coma, vol. 42, Iss. 2, Feb. 1994 pp. 773–782.

Jennison et al, "Maximum Likelihood Image Reconstruction From Fourier–Offset Data Using the Expectation–Maximization Algorithm", ICASSP '91 Acoastics, Speech & Signal Processing Conference, 1991, pp. all.

*Primary Examiner*—Young T. Tse
*Assistant Examiner*—William Luther
*Attorney, Agent, or Firm*—Steven M. Rabin

[57] ABSTRACT

A sampling phase calculating part calculates a complex cross-correlation function; $c$ of a part corresponding to a training sequence $\phi$ of an equalizer of each sequence with respect to individual sample value sequences $y_i$ of a reception signal y(t) which are sampled in a plurality of different sampling phases and selects a sampling phase where the absolute value of the complex cross-correlation functions is maximized, then selects a sampling phase $\tau s$ where the bit error rate is minimized according to a calculation based on the above selected sampling phase. A sampling processing part samples the reception signals y(t) in the sampling phase $\tau s$ for use in obtaining estimated values $E\chi$ of a transmission symbol sequence in a Viterbi algorithm processing part (130) and a transmission line estimating part (140), thereby to obtain a transmission symbol sequence with an improved bit error rate and higher accuracy.

32 Claims, 14 Drawing Sheets

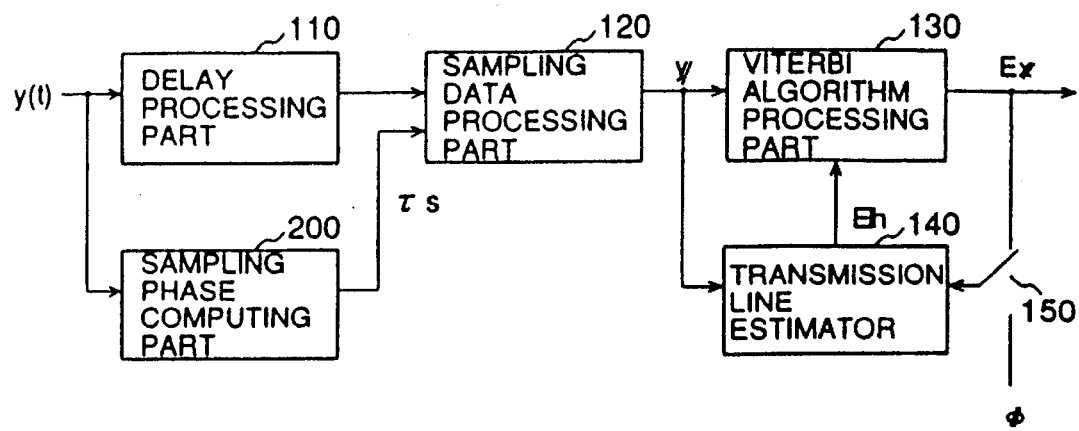
F I G.12 (a)

APPARATUS AND METHOD FOR ESTIMATING MAXIMUM LIKELIHOOD SEQUENCE USING OPTIMUM SAMPLING PHASE

FIELD OF THE INVENTION

The present invention relates to a maximum likelihood sequence estimator to be used as an equalizer for compensating waveform distortions through transmission lines in receivers and others used in digital mobile telephony.

BACKGROUND ART

Lately, development of digital mobile telephone systems has proceeded rapidly. However, there has been a problem that, in land digital mobile telephony, waveforms of reception signals would be considerably distorted due to a number of interference waves which bring about the delay in reception and frequency selective fading which is caused by high speed movement of mobile terminals. Therefore this distortion should be compensated by an equalizer. Maximum likelihood sequence estimation which is performed by the equalizer is one of the most effective equalization methods for obtaining correct transmission data from reception signal waveforms which have been distorted due to such delay characteristics of the transmission lines (channel) as frequency selective fading.

The digital mobile telephone system is described below, referring to FIGS. 6 and 7.

It is expected that the digital mobile telephone system will use the TDMA (Time Division Multiple Access) scheme to efficiently use limited radio frequency bands and ensure easy connection to the ISDN (Integrated Service Digital Network) services which have been implemented for the fixed telecommunications networks. An example of the frame configuration of the TDMA scheme is shown in FIG. 6.

In FIG. 6, one frame comprises six time slots (time segments) Slot 1–6. One or two of these time slots are assigned to one subscriber. Time slots Slot 1–6 respectively consist of a 28-bit training sequence SYNC for synchronization and training of an equalizer, a 12-bit control information sequence SACCH, a 12-bit adjacent channel identification sequence CDVCC, data part DATA of 260 bits in total, and a 12-bit reserved area RSVD.

The leading position t slot (k) of the time slot assigned to each subscriber is detected by the frame synchronization mechanism. The position to be detected by the frame synchronization mechanism is an estimated leading position Et slot (k) (E means estimation) to be determined by estimation. This estimated leading position Et slot (k) is merely an estimated position and therefore is not always an accurate position, and therefore it may vary depending on compensation by the frame synchronization mechanism.

FIG. 7 is a block diagram showing the configuration of the transmitter and the receiver for digital mobile telephony.

In this transmitter/receiver configuration, the receiver 30 is connected to the output side of the transmitter 10 through the transmission line (channel) 20.

The transmitter 10 is composed of an encoder 11, a transmission low-pass filter (LPF) 12, a modulator 13 and other parts.

The receiver 30 is composed of a demodulator 31, a reception low-pass filter (LPF) 32, a frame synchronization mechanism 33, sampling parts 34, an equalizer 35, a decoder and other parts.

Operations of the transmitter 10 and receiver 30 are described below.

The transmitter 10 converts input data bm to transmission symbols $\mathcal{X}=\{x1, x2, \ldots, xN\}$ through the encoder 11 controls the band width through the transmission low-pass filter, generates a transmission complex base band signal s(t), modulates the transmission complex base band signal s(t) with a carrier through the modulator 13 and transmits it as signal Sc(t) to the transmission channel 20.

The receiver 30 converts signal rc(t), which has passed through the transmission channel 20, to complex base band signal r(t) through the demodulator 31, and obtains reception complex base band signal y(t) which is band-limited by the reception low-pass filter 32.

Then a leading position (time) Et slot(k) of the time slot (segment) assigned to a subscriber is estimated according to this signal y(t) by the frame synchronization mechanism 33, and the reception signal y(t) is sampled by the sampling part 34 according to the following equation:

$$\mathcal{Y}=[y\ (Et\ \text{slot}\ (k)+\tau 1+(n-1)\ T)](n=1, 2, \ldots, N) \quad (1)$$

where,

Et slot (k): Estimated leading time of the kth assigned time slot (E means estimation.)

$\tau 1$: Fixed sampling phase

T: Symbol interval time

The characteristic of the transmission channel 20 due to the frequency selective fading is compensated with the sample value sequence $\mathcal{Y}$ of signal y(t) by the equalizer 35, and a transmission symbol is estimated.

Finally, estimated values $E\mathcal{X}=\{Exn\}(n=1, 2, \ldots, N$; E means estimation) are decoded by the decoder 36 and estimated values Ebm of transmitted data are obtained.

The following describes the above described maximum likelihood sequence estimation which constitutes the equalizer.

As regards the maximum likelihood sequence estimation, the reference "J. G. Proakis 'Digital Communications' (1983) New York: McGraw-Hill, pp. 548–554, pp. 610–648" is known.

As disclosed in the above reference, the maximum likelihood sequence estimation is intended to estimate the transmission symbol sequence $\mathcal{X}=\{x1, x2, \ldots, xN\}$ for which the probability (likelihood) of materializing the reception signal sequence $\mathcal{Y}=\{y1, y2, \ldots, yN\}$ with the impulse response h(t), as known when the reception signal sequence $\mathcal{Y}=\{y1, y2, \ldots, yN\}$ in a certain range, is obtained. This maximum likelihood sequence is obtained by, after all, obtaining the symbol sequence $\mathcal{X}=\{x1, x2, \ldots, xN\}$ in which the following value is maximized $$-\sum_{k=1}^{N} |yk - \sum_j xj\ h\ (t-jT)|^2 \quad (2)$$

if a white Guassian noise is assumed as the noise of the transmission line.

Equation (2) is efficiently calculated by using the Viterbi algorithm which is known as a decoding method for convolutional codes.

The following briefly describes the principle of the Viterbi algorithm applied to the maximum likelihood estimation, referring to FIG. 8 which shows a model of the transmission path.

The transmission path is assumed in a discrete time model n which the impulse response shown in FIG. 8 is limited. In FIG. 8, numeral 40 denotes a delay element with a symbol interval T, numeral 41 denotes a multiplier, numeral 42 denotes an accumulator and numeral 43 denotes an adder.

$\mathbb{h} = \{hj\}(j=0, \ldots, L)$ is a set of sample values h (t–jT) of the impulse response h(t) at the symbol interval T of the transmission path that includes the transmission channel 20 and the transmission and reception low-pass filters 12 and 32, and the length of the impulse response is (L+1) T. Wn is the noise of the transmission path which is additive white Guassian noise. According to this assumption, equation (2) is as given below.

$$-\sum_{k=1}^{N} |y_k - \sum_{j=0}^{L} x_{k-j} h_j|^2 \quad (3)$$

Therefore, the sum Jn up to k=n in equation (3) is as given below using the sum $J_{n-1}$ up to k=n–1.

$$J_n = J_{n-1} - |y_k - \sum_{j=0}^{L} x_{n-j} h_j|^2 \quad (4)$$

In this case, $J_n$ is a value which is proportional to the logarithmic likelihood of the reception signal sequence up to k=1 to n and referred to as the "path-metric" value, and the second term of the right side of equation (4) is a value which is proportional to the logarithmic likelihood as to the state transition (branch) and is referred to as the "branch-metric" value.

On the other hand, the state of the transmission path model shown in FIG. 8 at timing n–1 is given by the following status vector.

$$Sn-1 = \{Xn-1, Xn-2, \ldots, Xn-1\} \quad (5)$$

If there are M types of transmission symbols, $M^L$ types of states are available for the transmission path.

Assuming the transition from state $S_{n-1}$ at timing n–1 to state Sn at timing n, transitions from M types of states $S_{n-1}$ are available for each of $M^L$ types of states $S_n$. The state transition between these timings is referred to as a "branch" and each of Mn types of paths which follow up the states are referred to as a "path". There are paths from M types of states at the preceding timing for each of $M^L$ types of available states at respective timings.

The Viterbi algorithm is for calculating the path-metric value of equation (4) with respect to M number of available paths in respective states at respective timings to select a path with the largest value. Accordingly, $M^L$ types of paths are left at each timing and the past paths are gradually converged to one path. An estimated value of the transmission symbol sequence is obtained from the path to which the past paths finally converge.

FIG. 9 is a block diagram showing an example of a configuration of the conventional maximum likelihood sequence estimator.

This maximum likelihood sequence estimator consists of a Viterbi algorithm processing part 50 and a transmission path estimating part 60.

Reception signal y(t) is sampled according to equation (1) by the sampling parts when the kth assigned time slot is to be processed, and entered into the Viterbi algorithm processing part 50 and the transmission path estimating part 60.

The transmission path estimating part 60 estimates the impulse response of the transmission path according to an adaptive algorithm such as LMS (Least Mean Square), from the host equipment, not shown. The estimates provide information necessary for the sample value sequence $\mathcal{y}$ and the component units in the receiver 30 shown in FIG. 7 which correspond to the sample value sequence by using the given training sequence shown in FIG. 7 in the training sequence part of the time slot shown in FIG. 6 of the sample value sequence $\mathcal{y}$. In the part of the sample value sequence $\mathcal{y}$ other than the training sequence part of the time slot shown in FIG. 6, the estimation of the impulse response of the transmission path is continued using the estimated values E$\mathcal{x}$ of the transmission symbol sequence.

The estimated impulse response values E$\mathbb{h}$ of the transmission path are entered into the Viterbi algorithm processing part.

The Viterbi algorithm processing part 50 estimates a transmission symbol according to the above described principle by using the estimated impulse response values E h of the transmission path, which have been estimated as the sample value sequence $\mathcal{y}$ for the reception signal.

However, the conventional maximum sequence estimator carries out simulation under conditions that are applied in advance and fixes the sampling phase at a trade-off point which is determined by checking the bit error rate, and therefore there is a problem that an optimum sampling phase where the bit error rate is minimized under all conditions is not established.

In addition, the conventional maximum likelihood sequence estimator has accompanied a problem that, if the number of interference waves and the delay time differ, the optimum sampling phase which minimizes the bit error rate differs accordingly, and moreover the deviation of the sampling phase from the optimum sampling phase may cause deterioration of the bit error rate and it has been difficult to solve this problem.

An object of the present invention is to provide a maximum likelihood sequence estimator capable of solving the above described problems of the prior art with respect to the point that the optimum sampling phase where the bit error rate is minimized under all conditions is not always established since the sampling phase is fixed and also with respect to the point that, if the number of interference waves and the delay time differ, the optimum sampling phase where the bit error rate is minimized differs, and the deviation of the sampling phase from the optimum sampling may cause deterioration of the bit error rate.

SUMMARY OF THE INVENTION

A maximum likelihood sequence estimator in accordance with the present invention is provided with a sampling phase calculating part, a sampling processing part, a transmission path estimating part and a Viterbi algorithm processing part.

In this maximum likelihood sequence estimator, the sampling phase calculating part has the functions of sampling a reception signal y(t) from the transmission path at a symbol interval T in respective sampling phases of the sampling phase sequence $\tau = \{\tau(i)\}(i=1, 2, \ldots, M)$ by starting from the estimated leading time Et slot (k) of the time slot, obtaining the sample value sequences of M number of the above described different reception signal y(t) as shown below, $$\mathcal{y}_i = \{y(Et\ slot\ (k) + \tau\ (i) + (n-1)T)\}(i=1, 2, \ldots, M; n=1, 2, \ldots, Nt)$$

calculating the complex cross-correlation function $C = \{Ci\}$ (i=1, 2, \ldots, M) of the training sequence $\phi$ from the above sample value sequences $\mathcal{y}_i$ and the training sequence $\phi$, comparing the absolute values of the M complex cross-correlation values Ci, selecting a sampling phase $\tau$ (Ik) where the absolute values are maximized and obtaining the specified sampling phase τs from a calculation based on the selected sampling phase τ (Ik).

The sampling processing part has the function to sample the above described reception signal y(t), the samples being entered at specified timing, with the sampling phase τs and the symbol interval T, starting from the estimated leading time Et slot (k), and obtaining the sample value sequence $y=\{yn\}(n=1, 2, \ldots, N)$.

The transmission path estimating part has the function to obtain the estimated values $E_h=\{E hj\}(j=0, 1, \ldots, L)$ of the impulse response of the above transmission path according to the adaptive equalizing algorithm with respect to the sample value sequence $y$ and the training sequence $\phi$ corresponding thereto and also with respect to the estimated values $x$ of the transmission symbol sequence and the sample value sequence $y$.

The Viterbi algorithm processing part has the function to obtain the estimated values $Ex$ of the above described transmission symbol sequence from the sample value sequence $y$, according to the Viterbi algorithm on the basis of the above estimated values $E_h$.

According to the present invention, the sampling phase calculating part of the maximum likelihood sequence estimator, which has the above described configuration, calculates for the different sampling phases τ(i) of the sample phase sequence τ, complex cross-correlation values Ci of the cross-correlation function $c=\{Ci\}$, of the training sequence $\phi$ of the equalizer from the portions corresponding to the sample value sequences $yi$ and the training sequences $\phi$ of the equalizer for the sample value sequences with respect to individual sample value sequences $yi$ for the reception signal y(t) which has been sampled in the plurality of different sampling phases. After a sampling phase τ (Ik) where the complex cross-correlation function {Ci} is maximized has been selected, a sampling phase us where the bit error rate is minimized is calculated through calculations based on the selected sampling phase τ (Ik) and given to the sampling processing part.

The sampling processing part samples the reception signal y(t), so that the samples are entered at the specified timings, with the sampling phase us and the symbol interval T, to obtain the sample value sequence $y$, and sends it to the transmission path estimating part and the Viterbi algorithm processing part.

The transmission path estimating part functions to obtain estimated values E h of the impulse response of the transmission path from the sample value sequence $y$ and the training sequence $y$ corresponding to the sample value sequence $y$ in the training sequence part of the sampling value sequence $y$, and also to obtain estimated values $E_h$ of the impulse response of the transmission path by using the estimated values $Ex$ of the sample value sequence $y$ and the transmission symbol sequence for the reception signal y(t) in the part other than the training sequence of the sampling value sequencer $y$, and the estimated values $E_h$ obtained are given to the Viterbi algorithm processing part.

The Viterbi algorithm processing part functions to obtain the estimated values of the transmission symbol sequence $Ex$ based on the estimated values $Ey$ of the impulse response of the transmission path.

Thus, the present invention enables calculations of the sampling phase for each time segment k, to be made simply and accurately where the bit error rate is estimated to be at least from a plurality of different sampling phases and enable estimates to be made which provide a more precise transmission symbol sequence in which the bit error rate is improved.

Accordingly, the present invention also enables a solution to be obtained for the problem that the optimum sampling phase where the bit error rate is minimized under all conditions is not always established, since the sampling phase is fixed as in the conventional case, and also for the problem that if the number of interference waves and the amount of delay differ, the optimum sampling phase where the bit error rate is minimized differs and moreover the deviation of the sampling phases from the optimum sampling phase causes deterioration of the bit error rate.

BEST MODE FOR CARRYING OUT THE INVENTION

First Embodiment

Figure 7:
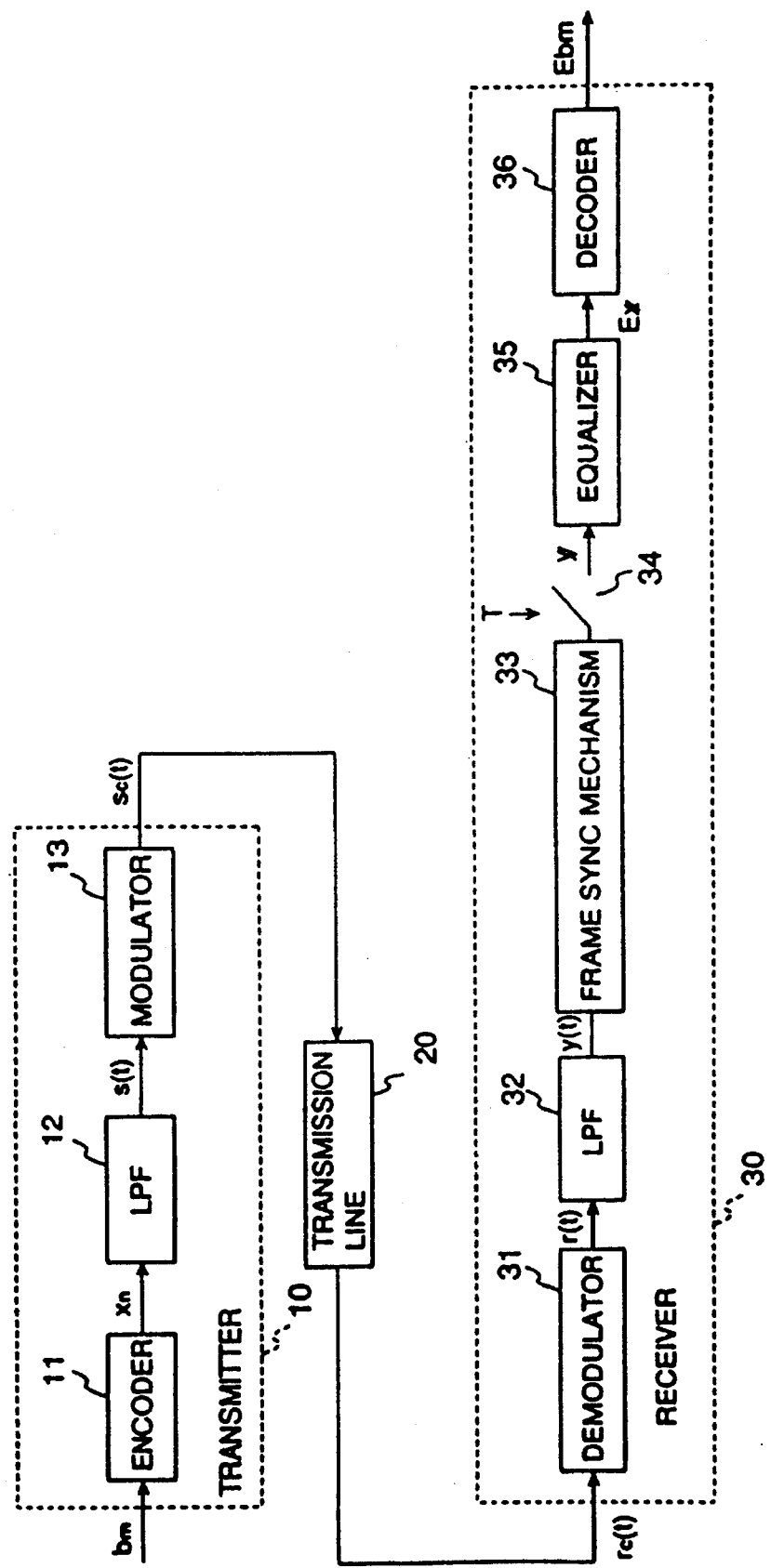
FIG. 7 is a diagram showing a configuration of a transmitter and a receiver for digital mobile telephony.
Figure 8:
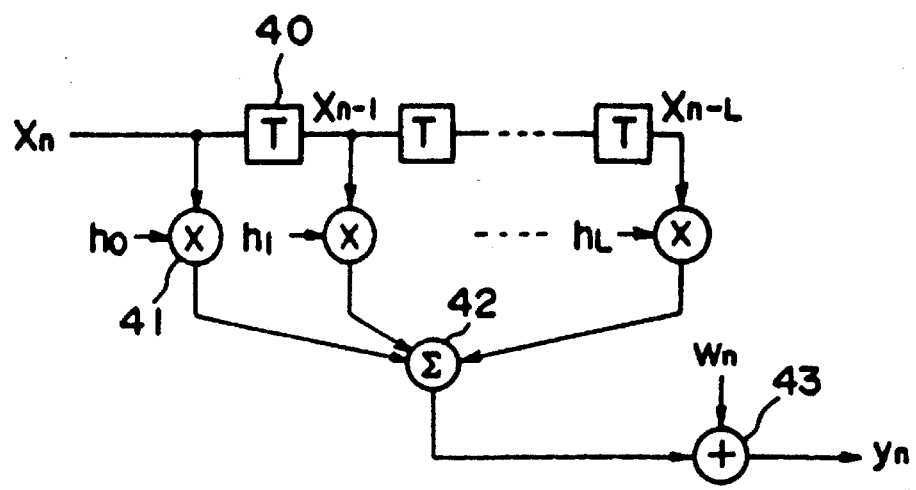
FIG. 8 is a diagram showing a model of a transmission path shown in FIG. 7.
Figure 9:
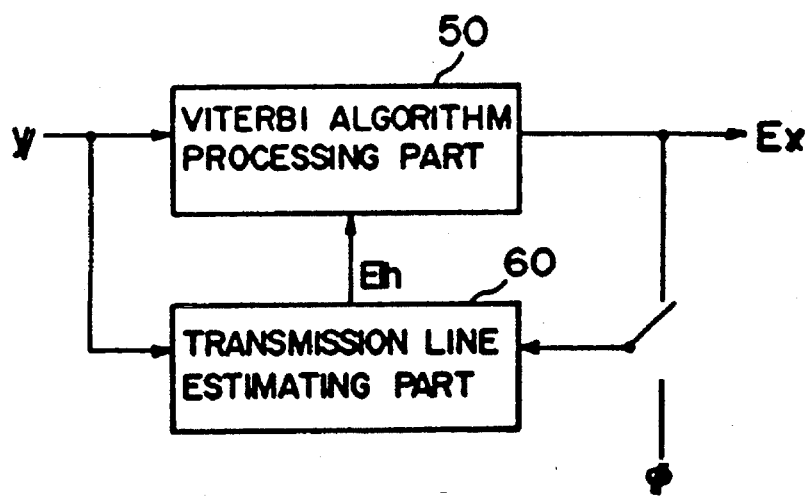
FIG. 9 is a diagram showing a configuration of a conventional maximum likelihood sequence estimator.

In the first embodiment of the present invention, a maximum likelihood sequence estimator for forming, for example, an equalizer 35 and sampling parts 34 in a receiver 30 shown in FIG. 7 is provided. The embodiment is described as to the case where a sampling phase us which is estimated to provide the least bit error rate is calculated from the sequence τ={τ(i)}(i=1, 2, ..., M) of simple non-increasing or simple non-decreasing sampling phases.

Figure 1A:
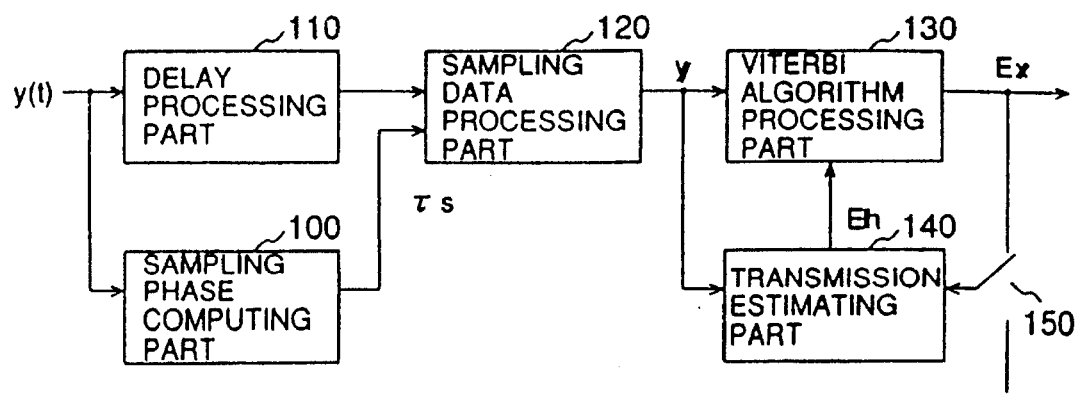
FIGS. 1(a) and 1(b) are diagrams showing a configuration of a maximum likelihood sequence estimator which is a first embodiment of the present invention.
Figure 1B:
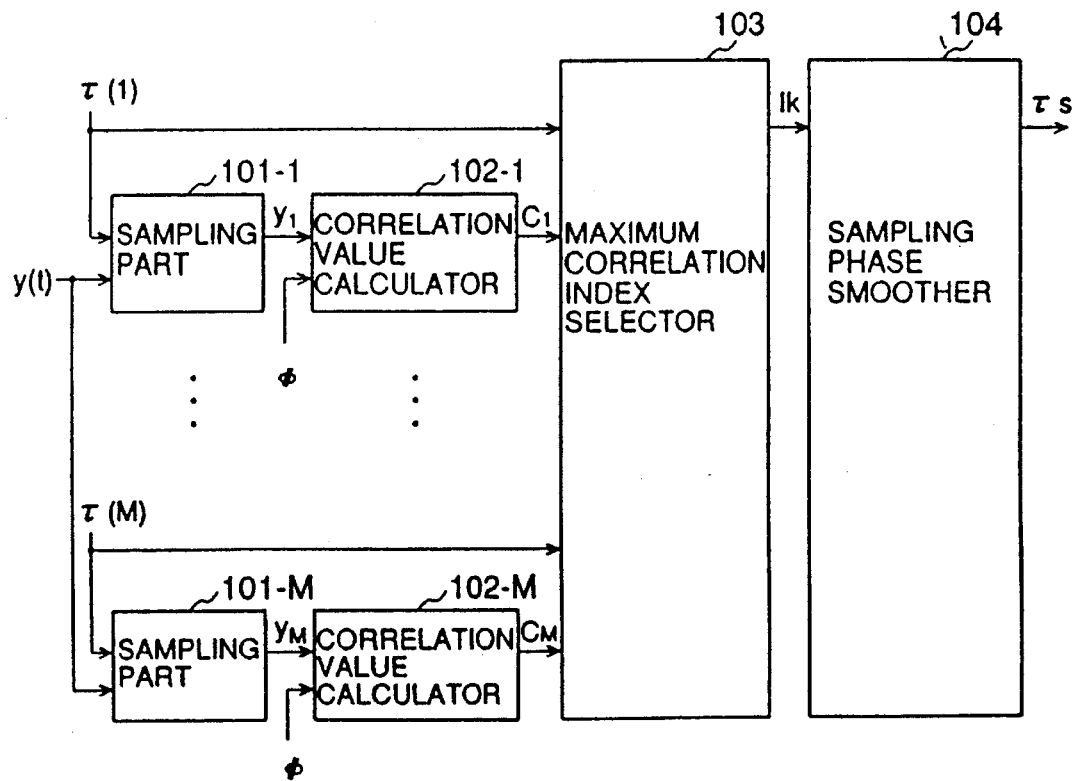

FIGS. 1(a) and 1(b) show a configuration of a maximum likelihood sequence estimator which is an embodiment of the present invention, wherein FIG. 1(a) is a functional block diagram of the whole maximum likelihood sequence estimator and FIG. 1(b) is a functional diagram of the sampling phase calculating part shown in FIG. 1(a).

In FIG. 1(a), the maximum likelihood sequence estimator comprises a program controller which employs a discrete circuit such as an integrated circuit or a processor. The maximum likelihood sequence estimator is provided with a sampling phase calculating part 100, a delay processing part 110, a sampling processing part 120, a Viterbi algorithm processing part 130 and a transmission path estimating part 140.

The sampling processing part 120 is connected to the output sides of the sampling phase calculating part 100 and the delay processing part 110. The Viterbi algorithm processing part 130 and the transmission path estimating part 140 are connected to the output side of the sampling processing part 120.

The sampling phase calculating part 100 has the functions to sample reception signal y(t) from the transmission path, calculate the specified sampling phase τs through calculations for sample value sequences $\mathcal{Y}i$ ={yin}(i=1, 2, ..., M; n=1, 2, ..., Nt) and the training sequence SYNC $\phi$={φn} (n=1, 2, ..., Nt) and giving the sampling phase obtained to the sampling processing part 120.

The delay processing part 110 functions to give the reception signal y(t) which has been delayed as long as specified to the sampling processing part 120.

The sampling processing part 120 functions to obtain the sample value sequence $\mathcal{Y}$={yn}(n=1, 2, ..., N) by sampling the reception signal y(t) from the delay processing part 110 with the sampling phase τs and the symbol interval T, starting from the estimated leading time Et slot (k) of the time slot when the assigned kth time slot is to be processed and gives it to the Viterbi algorithm processing part 130 and the transmission path estimating part 140.

The Viterbi algorithm processing part 130 functions to obtain the estimated values E$\mathcal{X}$={Exn} (n=1, 2, ..., L) of the transmission symbol sequence according to the principle of the Viterbi algorithm, which has conventionally been used, in accordance with the input of the sample value sequence $\mathcal{Y}$ and the estimated values E$_{\text{h}}$={Ehj} (j=0, 1, ..., L) and comprises branch metric calculation means, path metric calculation means and other means.

Figure 6:
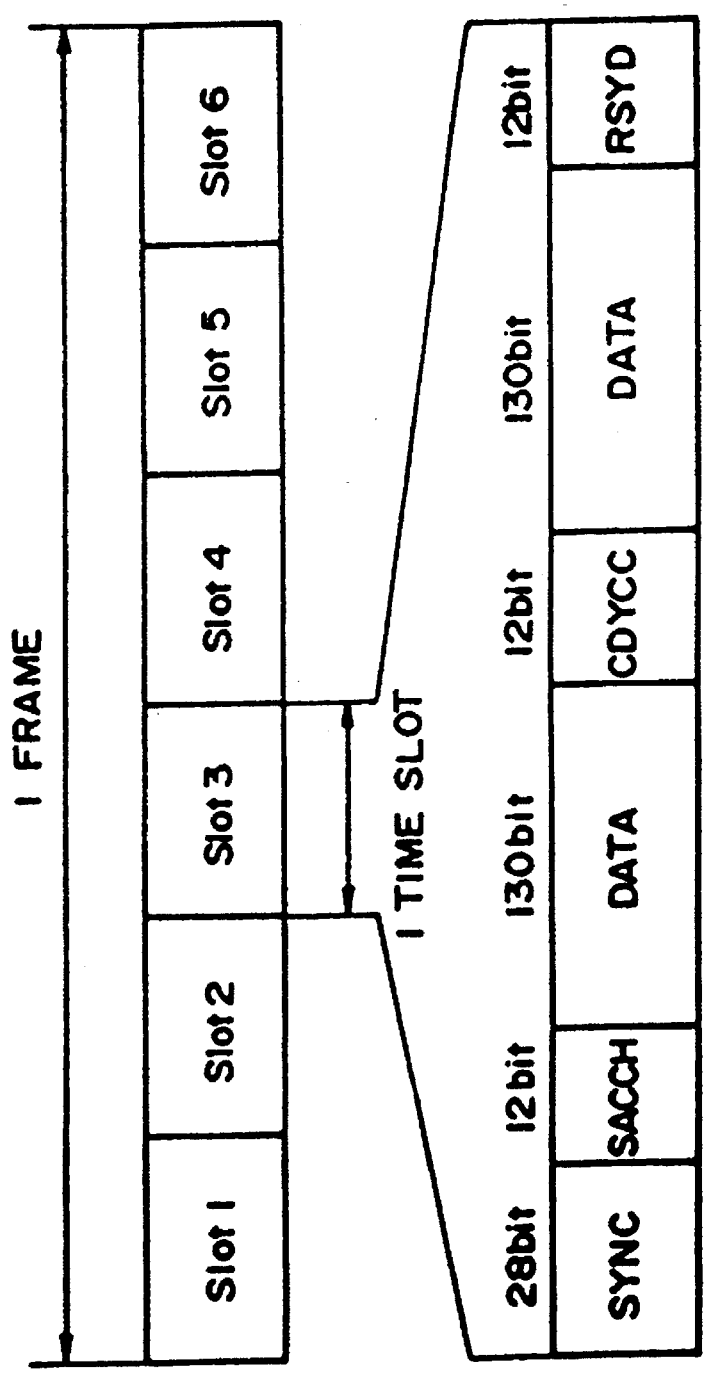
FIG. 6 is a diagram showing a frame configuration of a TDMA scheme.

The transmission path estimating part 140 functions to obtain the estimated values E$_{\text{h}}$ of the impulse response of the transmission path from the sample value sequence $\mathcal{Y}$ and the training sequence $\phi$ corresponding thereto in the training sequence part of the time slot shown in FIG. 6 of the sample value sequence, and also the estimated values E$_{\text{h}}$ of the impulse response by using the sample value sequence $\mathcal{Y}$ of reception signal y(t) and the estimated values E$\mathcal{X}$ of the transmission symbol sequence in the part other than the training sequence part of the time slot shown in FIG. 6 of the sample value sequence $\mathcal{Y}$, and gives the estimated values E$_{\text{h}}$of the impulse response to the Viterbi algorithm processing part 130.

Switch means 150 functions to switch over the transmission path estimating part 140 to the training sequence $\phi$ when processing the training sequence part of the time slot shown in FIG. 6 of the sample value sequence $\mathcal{Y}$, and to switch over to the estimated value E$\mathcal{X}$ of the transmission symbol sequence when processing the part other than the training sequence part and gives the switched over signals to the transmission path estimating part 140.

Figure 2:
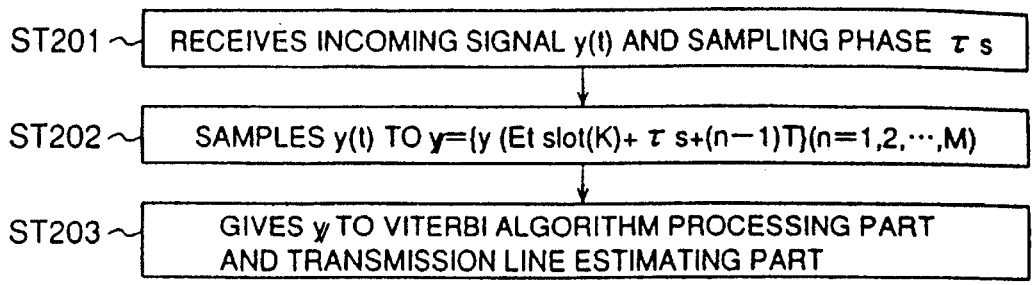
FIG. 2 is a flow chart showing operation of a sampling processing part of the present invention.
Figure 3:
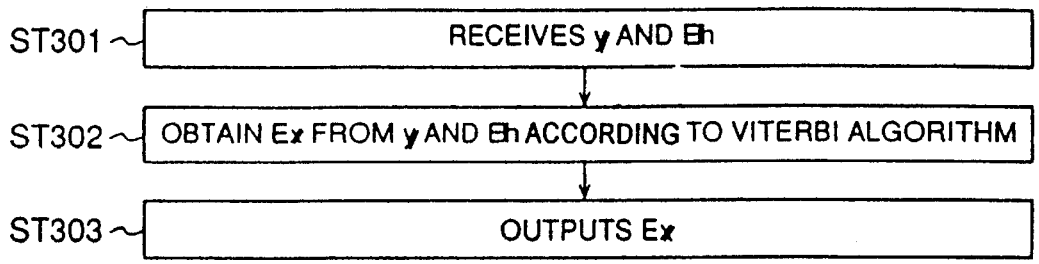
FIG. 3 is a flow chart showing operation of a transmission path estimating part according to the present invention.
Figure 4:
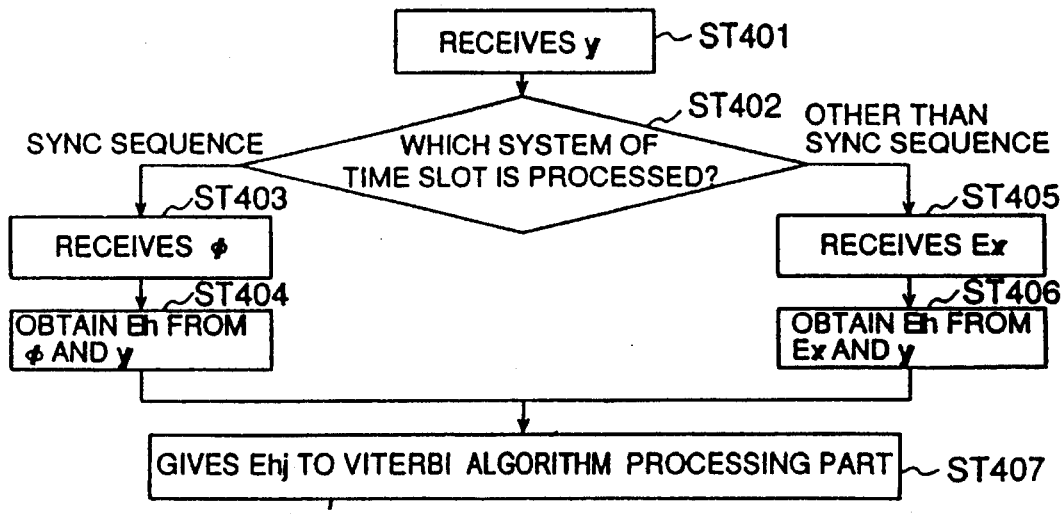
FIG. 4 is a Viterbi algorithm processing part according to the present invention.

FIG. 2 is a flow chart showing the operation of the sampling processing part, FIG. 3 is a flow chart showing the operation of the Viterbi algorithm processing part and FIG. 4 is a flow chart showing the operation of the transmission path estimating part.

The operation of the maximum likelihood sequence estimator in accordance with the present invention is described below referring to FIGS. 2, 3, and 4 and FIG. 1(a).

Reception signal y(t) is entered into the sampling phase calculating part 100 and the delay processing part 110 for each assigned time slot.

For processing the kth assigned time slot, the sampling phase calculating part 100 samples the reception signal at M number of different sampling phases τ (i) and the symbol interval T, starting from the estimated leading time Et slot (k) of the time slot as given below.

$$\{y(Et\ slot\ (k)+\tau(i)+(n-1)T)\}\ (i=1, 2, \ldots, M;\ n=1, 2, \ldots, Nt)$$

Subsequently, the sampling phase calculating part 100 calculates the complex cross-correlation function of the part corresponding to the training sequence of the equalizer, and the training sequence $\phi$ of the equalizer of the sample value sequences is calculated for each i value. The sampling phase where the absolute value of this complex cross-correlation function is maximized is selected and the sampling phase τs calculated based on the calculated sampling phase is given to the sampling processing part 120.

On the other hand, the reception signal y(t), upon entering the delay processing part 110, is delayed until the sampling phase us is selected by the sampling phase calculating part 100 and then entered into the sampling processing part 120.

The sampling processing part 120 receives the reception signal y(t) and the sampling phase τs (ST201) and, when processing the kth assigned time slot, samples reception signal y(t) according to the following equation (ST202), $$\mathcal{Y}=\{y(Et\ slot\ (k)+\tau s+(n-1)T)\}(n=1, 2, \ldots, N) \quad (6)$$

where,

Et slot (k): Estimated leading time of the kth assigned time slot (time segment k)

τs: Sampling phase

T: Symbol interval time and the sample value sequence $\mathcal{Y}$ is given to the Viterbi algorithm processing part 130 and the transmission channel estimating part 140 (ST203).

The Viterbi algorithm processing part 130 functions to obtain the values E$\mathcal{X}$ estimated from the sample value sequence $\mathcal{Y}$ from the sampling processing part 120 and the estimated values E$_{\text{h}}$ (ST301) from the transmission channel estimating part 140 according to the above described principle, and outputs the estimated values (ST303).

The transmission path estimating part 140 functions to obtain the estimated values E$_{\text{h}}$ of the impulse response of the transmission path from the sample value sequence $\mathcal{Y}$ and the corresponding training sequence $\phi$ (ST403) which are switched over and entered by switch means 150 according to the adaptive equalizing algorithm in the training sequence SYNC part of the time slot shown in FIG. 6 of the received sample value sequencer $\mathcal{Y}$ (ST404), and gives the estimated values to the Viterbi algorithm processing part 130 (ST407). In addition, the transmission path estimating part 140 functions to obtain the estimated values E$\hat{h}$ of the impulse response of the transmission path (ST406) by using the sample value sequence $\mathcal{Y}$ of reception signal y(t) and the estimated values E$\hat{x}$ (ST405) of the transmission symbol sequence (which are switched over and entered from switch means 150) and gives the estimated values E$\hat{h}$ h to the Viterbi algorithm processing part 130 (ST407) in the part, other than the training sequence part, of the time slot shown in FIG. 6 of the sample value sequence $\mathcal{Y}$.

The configuration of the sampling phase calculating part 100 shown in FIG. 1(b), which is a feature of the present invention, is now described.

This sampling phase calculating part 100 is provided with sampling parts 101-1~101-M which sample reception signal y(t) at the sampling phases of the above described sampling phase sequence $\tau$ and the symbol interval T, starting from the estimated leading time Et slot (k) of the time slot and obtain M number of sample value sequences $\mathcal{Y}i$ of the reception signal y(t). A maximum correlation index selector 103 is connected to the output sides of sampling parts 101-1~101-M through the correlation value calculators 102-1~102-M.

The correlation value calculators 102-1~102-M function to calculate complex cross-correlation values Ci (i=1, 2, . . . , M) from the sample value sequence $\mathcal{Y}i$ and corresponding training sequence $\phi$.

The maximum correlation index selector 103 compares the absolute values of M complex cross-correlation values Ci which are calculated by the correlation value calculators 102-1~102-M and selects the sampling phase $\tau$ (Ik) where the absolute values are maximized. In addition, the maximum correlation index selector functions to output the index Ik of the selected sampling phase $\tau$ (Ik) as the index Ik of the sampling phase which is selected when the sampling phase for the time segment k is selected, and a sampling phase smoother 104 is connected to the output side thereof.

The sampling phase smoother 104 functions to obtain the sectional weighted mean value, sectional maximum value and sectional minimum value of index Ik selected by the maximum correlation index selector 103 and outputs the sampling phase $\tau s$ corresponding to the index which is obtained by adding a value, obtained by subtracting the sectional minimum value from the sectional maximum value and multiplying it by a constant, to the sectional weighted mean value.

Figure 5:
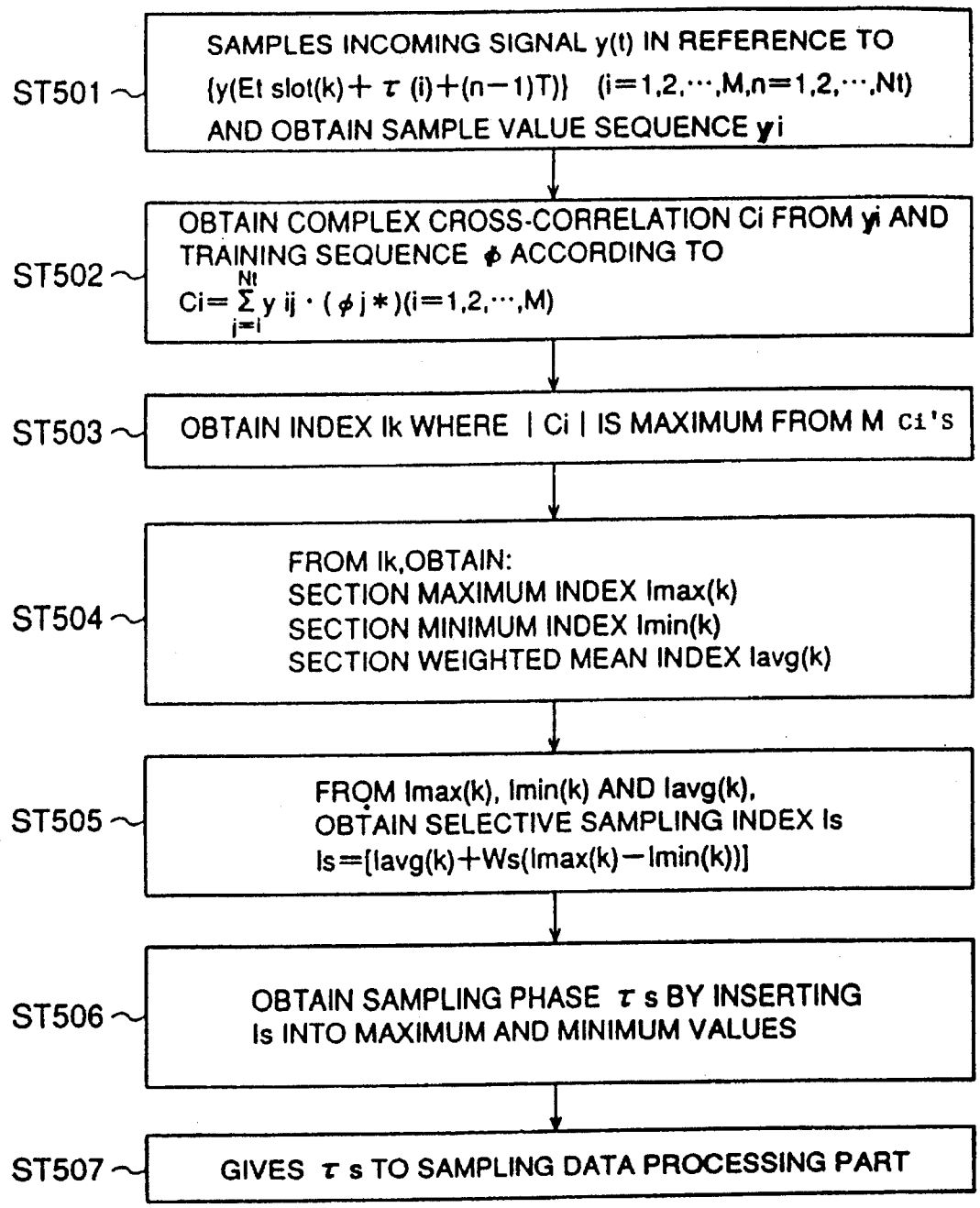
FIG. 5 is a flow chart showing operation of a sampling phase calculating part according to a first embodiment of the present invention.

FIG. 5 is a flow chart showing the operation of the sampling phase calculating part according to the first embodiment.

The operation of the sampling phase calculating part 100 is described below, referring to FIGS. 5 and 1(b).

Reception signal y(t) is entered for each assigned time slot and sampled in the sampling parts 101-1~101-M for every finite section, according to the following equation when processing the kth assigned time slot, and entered into the correlation value calculators 102-1~102-M (ST501).

$$\mathcal{Y}i = \{y(Et \text{ slot } (k)+\tau(i)+(n-1) T)\} (i=1, 2, \ldots, M; n=1, 2, \ldots, Nt) \quad (7)$$

The correlation value calculators 102-1~102-M calculate the complex cross-correlation values Ci of the sample value sequences $\mathcal{Y}i$ and corresponding training sequence $\phi$ of reception signal y(t) according to the equation (8) given below and gives these values to the maximum correlation index selector 103 (ST502):

$$Ci = \sum_{j=1}^{Nt} yij(\phi j *) (i=1, 2, \ldots, M) \quad (8)$$

where * means that complex conjugation is used.

The maximum correlation index selector 103 selects the sampling phase $\tau$ (Ik) where the absolute values of M complex cross-correlation values Ci are maximized and gives this index to the sampling phase smoother 104 as the index Ik of the sampling phase which has been selected for slot (k) (the time segment k). The sample phase smoother 104 then performs the following calculations resulting in the sampling phase $\tau s$ and outputs $\tau s$ to the sampling data processing part 120 (ST504–ST507).

$$I \max (k) = \begin{bmatrix} \max Ij & k < Ls \\ 1 \leq j \leq k & \\ \max Ij & k \geq Ls \\ k-Ls+1 \leq j \leq k & \end{bmatrix} \quad (9)$$

$$I \min (k) = \begin{bmatrix} \min Ij & k < Ls \\ 1 \leq j \leq k & \\ \min Ij & k \geq Ls \\ k-Ls+1 \leq j \leq k & \end{bmatrix} \quad (10)$$

$$I \text{avg} (k) = \frac{\sum_{i=1}^{k} \{Wa(k-j+1)Ij\}}{\sum_{j=1}^{k} Wa(j)} \quad k < Ls \quad (11)$$

where,

Wa (j)(j=1, 2, . . . , Ls):Load coefficient

Ls: Maximum length of calculation $$Is=[Iavg(k)+Ws (Imax (k)-Imin (k))] \quad (12)$$

where,

[ ]: Gaussian notation (The maximum integer which does not exceed a value in the notation is returned.)

Ws: Shift coefficient

Is: Selection sampling phase index $$\tau s = \begin{bmatrix} \tau (1) & Is < 1 \\ \tau (Is) & 1 \leq Is \leq M \\ \tau (M) & M < Is \end{bmatrix} \quad (13)$$

Figure 10:
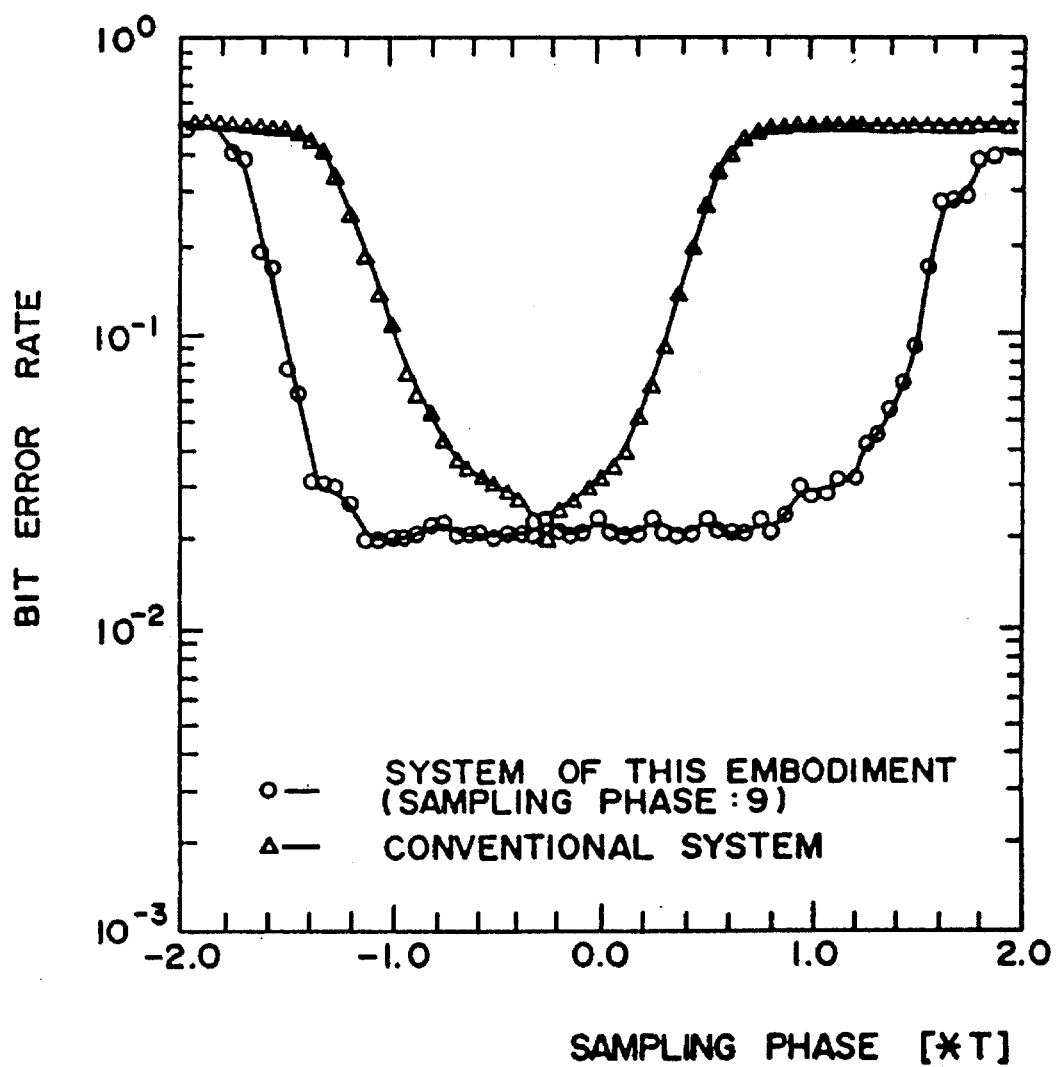
FIG. 10 is a sampling phase characteristic diagram when the amount of delay shown in FIG. 1 is 0.25T (10μ sec)
Figure 11:
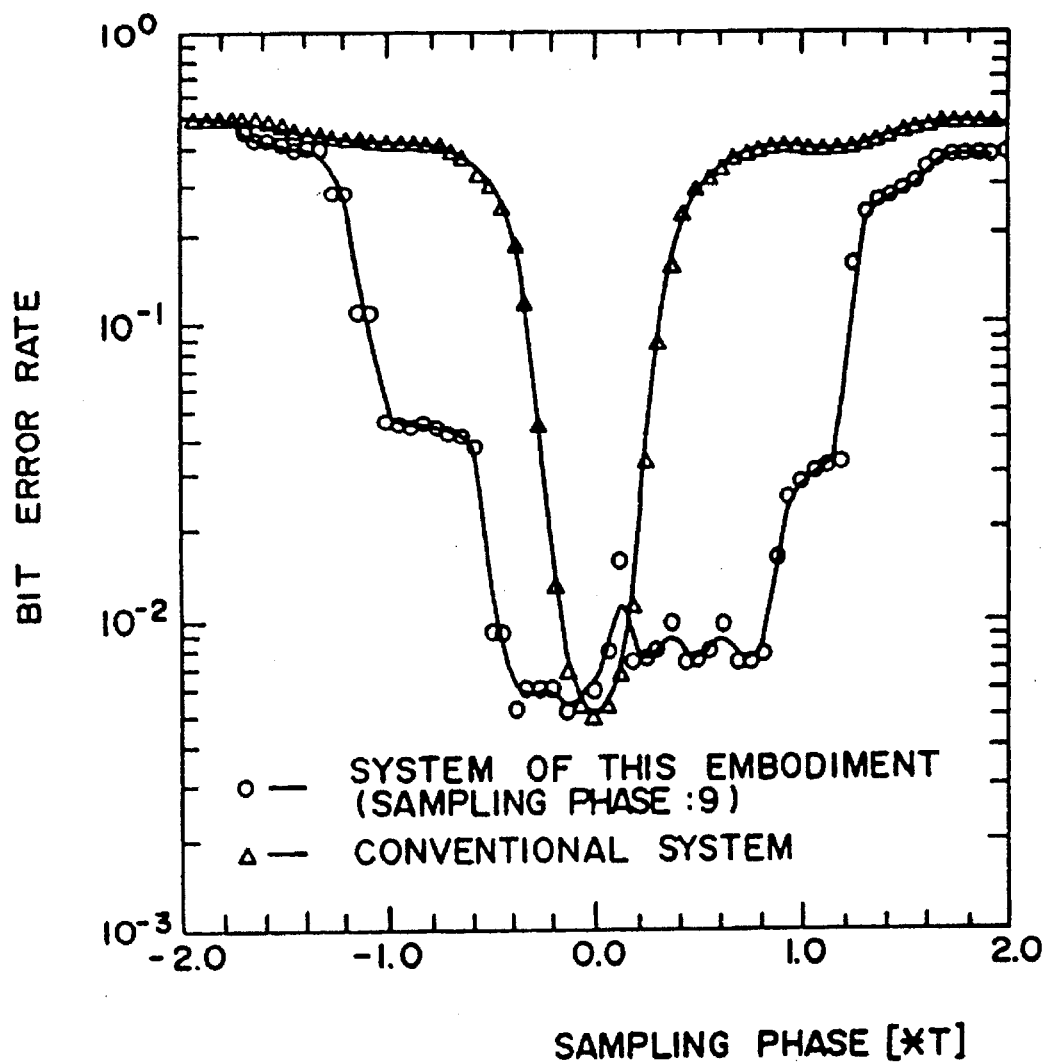
FIG. 11 is a sampling phase characteristic diagram when the amount of delay shown in FIG. 1 is 1.00T (40μ sec)

FIGS. 10 and 11 respectively show the results of simulation of the bit error rate in the case that this embodiment is applied. For this simulation, the frame configuration is of the North American Standard Digital Cellular Scheme shown in FIG. 6 and the transmission path model is a 2-wave non-correlated Rayleigh fading model.

FIG. 10 is a sampling phase characteristic diagram when the amount of delay shown in FIG. 1 is 0.25T (10µ sec) and FIG. 11 is a sampling phase characteristic diagram when the amount of delay shown in FIG. 1 is 1.00T (40µ sec). The horizontal axes of FIGS. 10 and 11 denote the sampling phase deviation from the center of a roll-off curve of a direct wave and the vertical axes denote the bit error rate (BER). From FIGS. 10 and 11, it is apparent that the bit error rate in the maximum likelihood sequence estimator of this embodiment, when the sampling phase deviates from the optimum point, is smaller than that in the case of the conventional maximum likelihood sequence estimator.

Thus, in this embodiment, the complex cross-correlation values Ci, for the training sequence $\phi$ of the equalizer of the parts $\{y (Et \text{ slot } (k)+\tau(1)+(n-1)T)\}$ (n=1, 2, . . . , Nt) corresponding to the training sequence $\phi$ of the sample value sequences $y_i$ of reception signal y(t), are calculated by the correlation value calculators 102-1~102-M with respect to each of a plurality of different sampling phases $\tau(i)$ when the reception signal is sampled with the above described sampling phases. Sampling phase $\tau_s$ is calculated from the sampling phases $\tau(i)$ where the complex cross-correlation values Ci are maximized by the maximum correlation index selector 103 and with the sampling phase smoother 104. Therefore the bit error rate (BER) can be improved to a greater degree than in the embodiments according to the prior art.

Second Embodiment

In the second embodiment, there is provided a maximum likelihood sequence estimator for forming, for example, the equalizer 35 and the sampling parts 34 in the receiver 30 shown in FIG. 7. The following describes an embodiment in which the sampling phase $\tau_s$ where the bit error rate is minimized, is calculated from a simple non-increasing or simple non-decreasing sampling phase sequence $\tau=\{\tau(i)\}$ (i=1, 2, ..., M).

Figure 12:
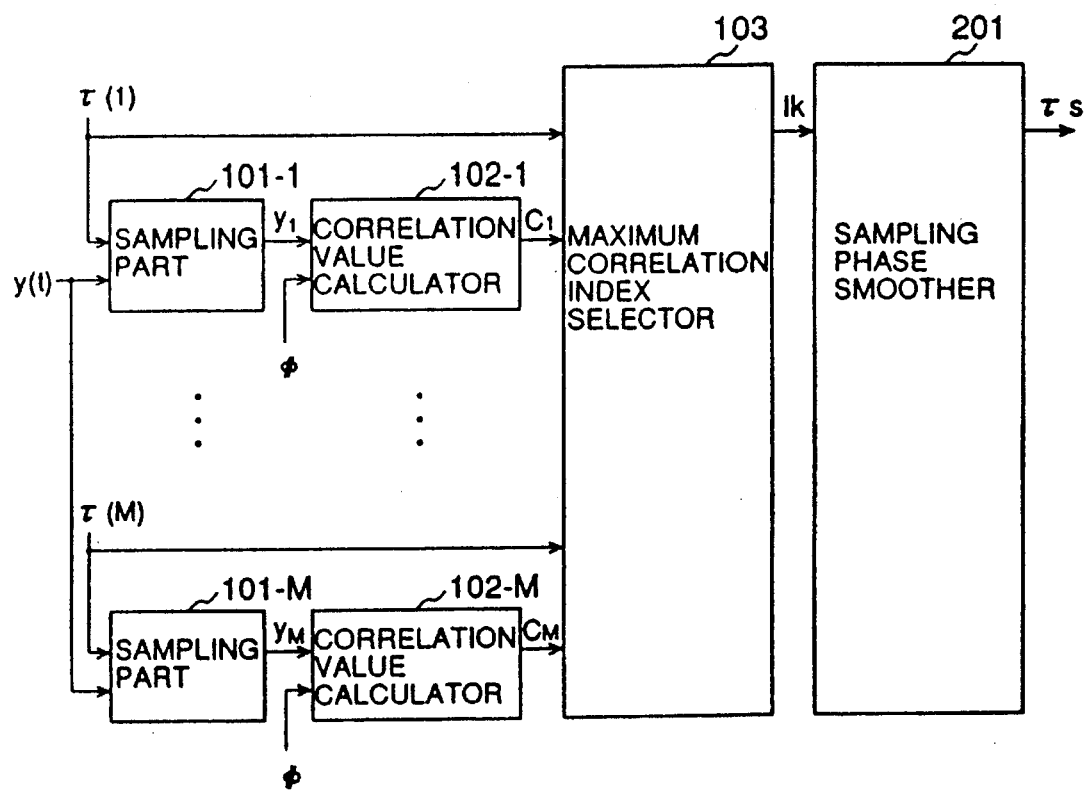
FIGS. 12(a) and 12(b) are diagrams showing a configuration of a maximum likelihood sequence estimator according to a second embodiment of the present invention.

FIGS. 12(a) and 12(b) show a configuration of a maximum likelihood sequence estimator which is the second embodiment of the present invention. FIG. 12(a) shows a functional block diagram of the whole sampling phase calculating part and FIG. 12(b) is a functional block diagram of the sampling phase calculating part shown in FIG. 12(a). In this case, the same components as those of the first embodiment are designated by the same reference symbols.

The second embodiment differs from the first embodiment only in the configuration of the sampling phase smoother in the sampling phase calculating part. The configuration of the sampling phase smoother 201 in the sampling phase calculating part 200 according to the second embodiment, is described below, referring to FIG. 12(b).

The sampling phase smoother 201 functions to obtain the weighted mean value, a maximum value and a minimum value of the index Ik selected by the maximum correlation index selector 103 and outputs a sampling phase $\tau_s$ corresponding to the index Ik, the index Ik being obtained by subtracting the minimum value from the maximum value, multiplying it by a constant $\alpha$ and adding the value obtained to the weighted mean value.

Other elements of the second embodiment shown in FIGS. 12(a) and 12(b) are the same as those of the first embodiment and therefore the description is omitted.

Figure 13:
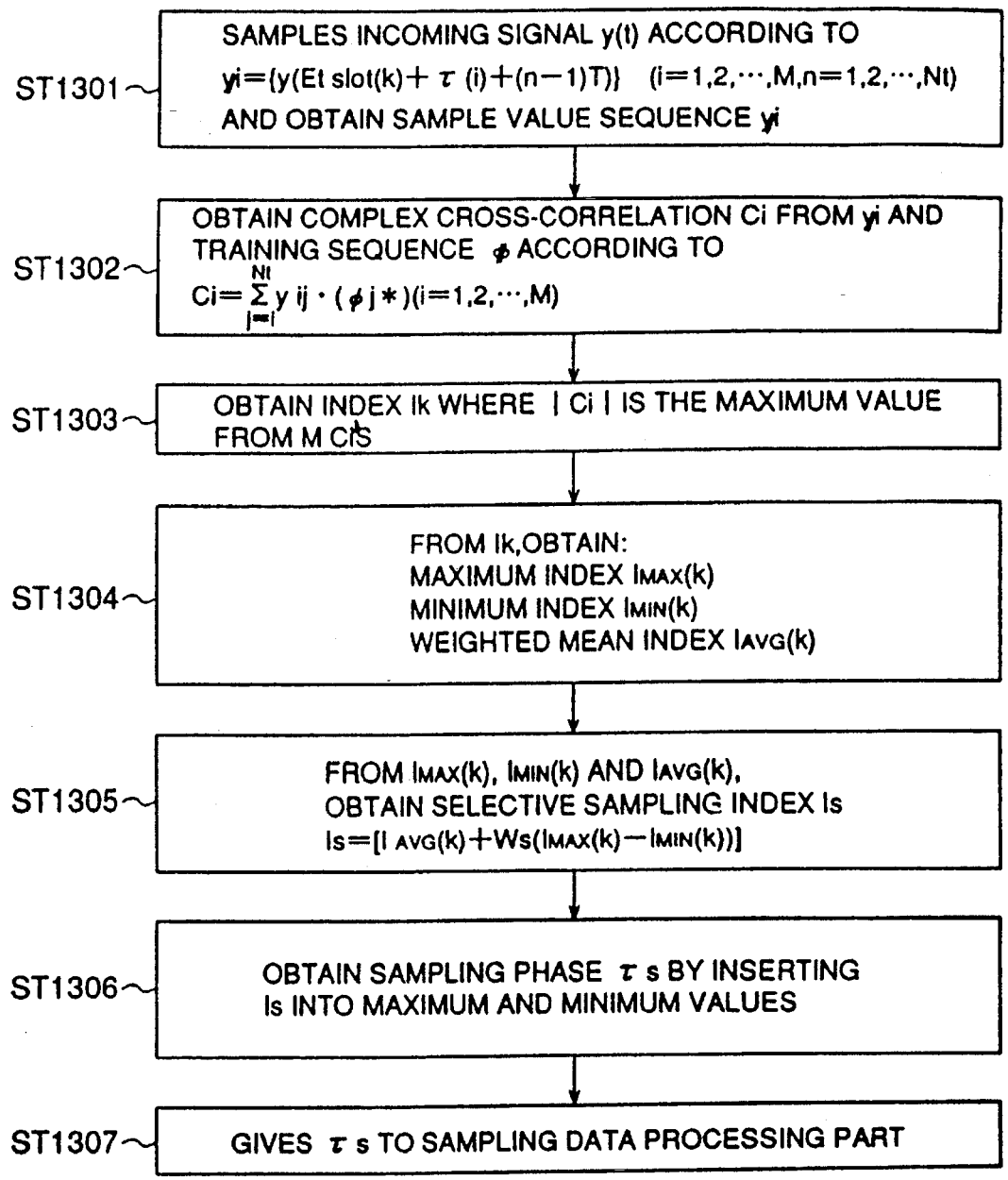
FIG. 13 is a flow chart showing operation of a sampling phase calculating part according to a second embodiment of the present invention.

FIG. 13 is a flow chart showing the operation of the sampling phase calculating part of the second embodiment according to the present invention.

The operation of the sampling phase calculating part 200 is described below, referring to FIG. 12(b) and FIG. 13.

The sampling phase calculator 200 according to the second embodiment, as in the first embodiment, obtains complex cross-correlation values Ci (i=1, 2, ..., M) from the reception signal y(t) and training sequence $\phi$ through the sampling parts 101-1~101-M and the correlation value calculating parts 102-1~102-M and gives these values to the maximum correlation index selector 103 (ST1301, ST1302).

When the index Ik is supplied from the maximum correlation index selector 103 to the sampling phase smoother (ST1303), the sampling phase smoother 201 outputs the sampling phase $\tau_s$ obtained from the above described equations (*12*) and (13) and the following equations (14)–(17) at the time of selection of the kth sampling phase (ST1304–ST1307).

$$I\,MAX\,(k) = \max_{1 \leq j \leq k} Ij \quad (14)$$

$$I\,MIN\,(k) = \min_{1 \leq j \leq k} Ij \quad (15)$$

$$I\,AVG\,(k) = (1 - \alpha)\,I\,AVG\,(k-1) + Ik \quad (16)$$

where, $\alpha$: constant $$I\,AVG\,(0) = 0 \quad (17)$$

The second embodiment described above enables to be obtained almost the same effects as the first embodiment, and also enables speed up of the estimation processing because the number of calculations in the sampling phase smoother 201 is small.

Third Embodiment

The third embodiment is a maximum likelihood sequence estimator for forming the equalizer 35 and the sampling part 34 in, for example, the receiver 30 shown in FIG. 7. The embodiment is described with respect to a case for calculating a sampling phase $\tau_s$ where the bit error rate is estimated to be minimum from an optional sampling phase sequence $\tau=\{\tau(i)\}$(i=1, 2, ..., M).

Figure 14A:
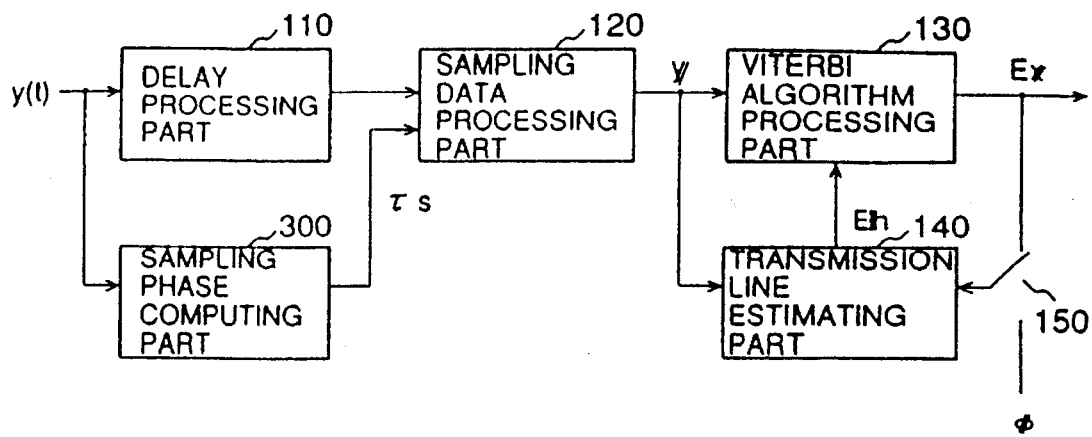
FIGS. 14(a) and 14(b) are diagrams showing a configuration of a maximum likelihood sequence estimator according to a third embodiment of the present invention.
Figure 14B:
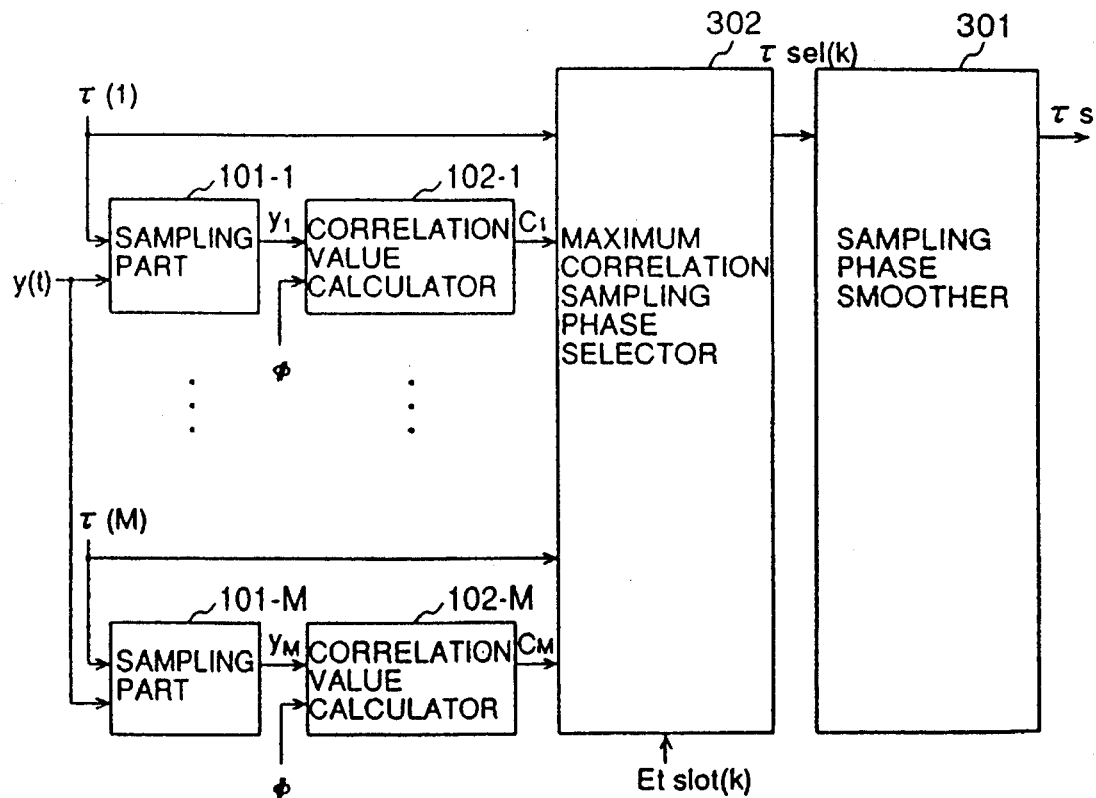

FIGS. 14(a) and 14(b) show a configuration of a maximum likelihood sequence estimator which is the third embodiment of the present invention, wherein FIG. 14(a) is a functional block diagram of the maximum likelihood sequence estimator and FIG. 14(b) is a functional block diagram of the sampling phase calculating part shown in FIG. 14(a). In this case, the components that are the same as in the first embodiment are denoted by the same reference symbols.

In the third embodiment, the internal configuration of the sampling phase calculating part differs from that of the first embodiment. The following describes the configuration of the sampling phase calculating part 300, referring to FIG. 14(b). In FIG. 14(b), the sampling phase calculating part 300 is provided with sampling parts 101-1~101-M which sample the reception signal y (t) in each time segment k at respective sampling phases of the sampling phase sequence $\tau=\{\tau(i)\}$ (i=1, 2, ..., M) and the symbol interval T as the symbol time, starting from the estimated leading time Et slot (k) of the time slot (time segment) k and obtain M number of different sample value sequences $y_i=\{y_{in}\}$ (i=1, 2, ..., M; n=1, 2 ..., Nt) of the reception signal. The maximum correlation sampling phase selector 302 is connected to the output sides of sampling parts 101-1~101-M through the correlation value calculators 102-1~102-M.

The correlation value calculators 102-1~102-M function to calculate for each time segment k complex cross-correlation values Ci (i=1, 2, ..., M) of the sample value sequences $y_i$ and the training sequence SYNC $\phi=\{\phi n\}$ (N=1, 2, ..., Nt).

The maximum correlation sampling phase selector 302 functions for each time segment k: (1) to compare the absolute values of M number of complex cross-correlation values Ci calculated by the correlation value calculators 102-1~102-M to determine which of the absolute values is maximum, (2) to select a sampling phase $\tau$ sel (k) for the time segment k corresponding to the value Ci whose absolute value is maximum, and (3) to output the selected sampling phase. The sampling phase smoother 301 is connected to the output side of the maximum correlation sampling phase selector 302.

The sampling phase smoother 301 functions to obtain a coordinate transformation term tc (k) for transforming the sampling phase to the coordinates in reference to the input timing of the reception signal when the frame synchronization is established in accordance with the estimated leading time Et slot (k) from the frame synchronization mechanism. The sampling phase smoother 301 functions to (1) obtain the sectional weighted mean value, the sectional maximum value and the sectional minimum value after adding the coordinate transformation term tc (k) to the sampling phase τ sel (k) selected by the maximum correlation sampling phase selector 302, (2) add a value, obtained by subtracting the sectional minimum value and the absolute value of the coordinate transformation term tc (k) from the sectional maximum value and multiplying it by a constant, to the sectional weighted mean value to obtain a resultant value, and (3) output the sampling phase τs obtained by subtracting the coordinate transformation term tc (k) from the resultant value.

The remainder of the configuration of the third embodiment shown in FIGS. 14(a) and 14(b) is the same as that of the first embodiment and therefore the description is omitted.

Figure 15:
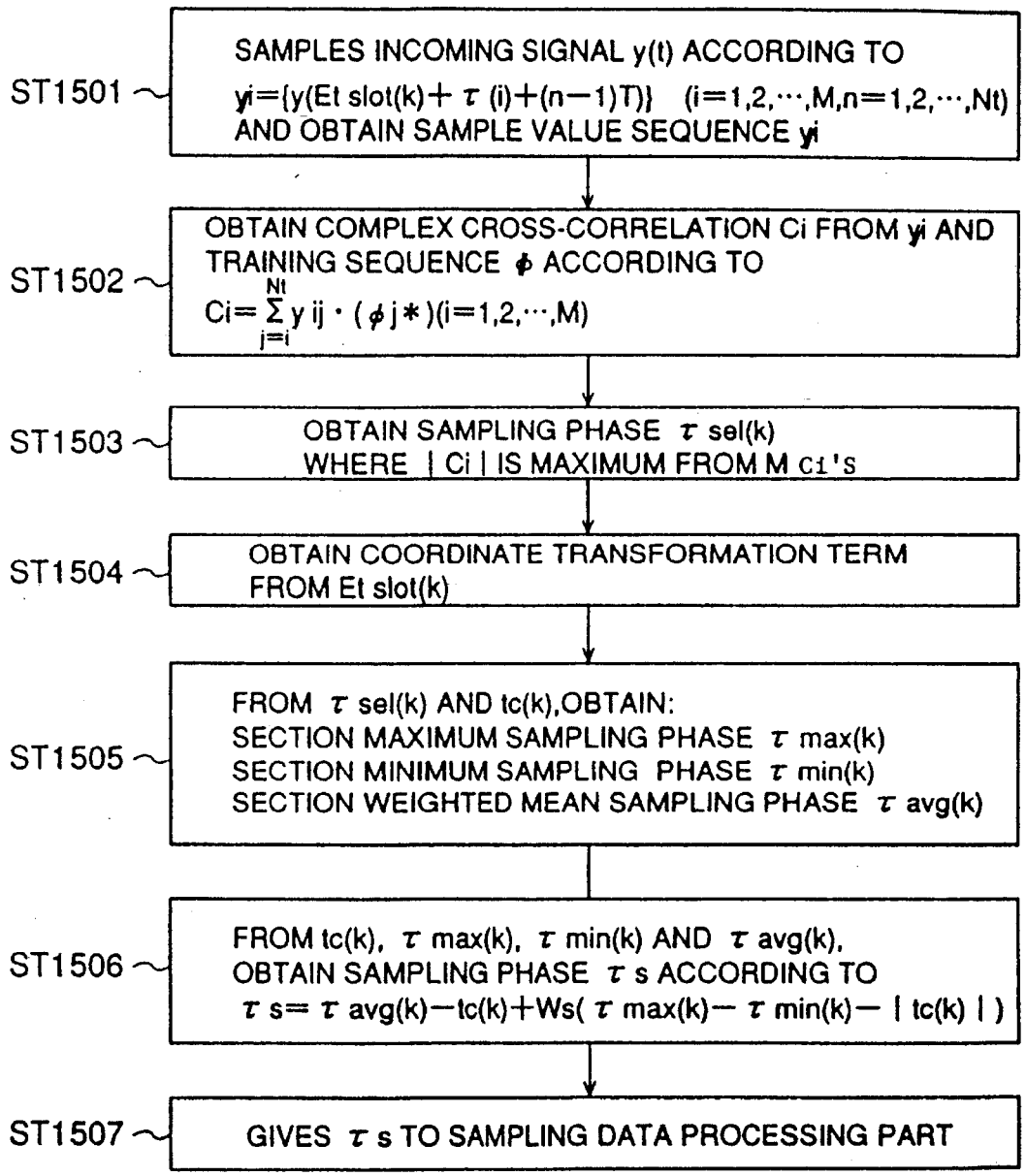
FIG. 15 is a flow chart showing operation of a sampling phase calculating part according to a third embodiment of the present invention.

FIG. 15 is a flow chart showing the operation of the sampling phase calculating part according to the third embodiment of the present invention.

The operation of the sampling phase calculating part 300 is described below, referring to FIGS. 15 and 14(b).

The reception signal is entered during each assigned time slot (time segment) and sampled by the sampling parts 101-1~101-M according to equation (7) when the kth assigned slot is processed, then entered respectively into the correlation value calculators 102-1~102-M (ST1501).

Each of correlation value calculators 102-1~102-M calculates complex cross-correlation values Ci of the sample value sequences $y_i$ and corresponding training sequence φ of reception signal y(t), according to equation (8) and gives the values obtained to the maximum correlation sampling phase selector 302 (ST1502).

The maximum correlation sampling phase selector 302 selects a sampling phase τ sel (k) where the absolute values of M number of cross-correlation values Ci are maximized and gives the selected sampling phase to the sampling phase smoother as the sampling phase τ sel (k) when the kth sampling phase is selected (ST1504). The sampling phase smoother 301 outputs the sampling phases τs obtained according to the following equations (18)~(23) (ST1504~ST1507).

$$\Delta tc(k) = Et\ slot(k) - Et\ slot(k-1) \quad (18)$$
$$k > 1$$

$$tc(k) = \begin{cases} \sum_{i=1}^{k=1} \Delta tc(k) & k > 1 \\ 0 & k = 1 \end{cases} \quad (19)$$

$$\tau\ max(k) = \begin{cases} max(\tau\ sel(j) + tc(j)) & k < Ls \\ 1 \leq j \leq k \\ max(\tau\ sel(j) + tc(j)) & k \geq Ls \\ k - Ls + 1 \leq j \leq k \end{cases} \quad (20)$$

$$\tau\ min(k) = \begin{cases} min(\tau\ sel(j) + tc(j)) & k < Ls \\ 1 \leq j \leq k \\ min(\tau\ sel(j) + tc(j)) & k \geq Ls \\ k - Ls + 1 \leq j \leq k \end{cases} \quad (21)$$

$$\tau\ avg(k) = \quad (22)$$

-continued $$\begin{cases} \dfrac{\sum_{j=1}^{k} \{Wa(k-j+1)(\tau\ sel(j) + tc(j))\}}{\sum_{j=1}^{k} Wa(j)} & k < Ls \\ \\ \dfrac{\sum_{j=1-Ls+1}^{k} \{Wa(k-j+1)(\tau\ sel(j) + tc(j))\}}{\sum_{j=1}^{Ls} Wa(j)} & k \geq Ls \end{cases}$$

$$\tau s = \tau\ avg(k) - tc(k) + Ws(\tau\ max(k) - \tau\ min(k) - |tc(k)|)$$

where,
Ws: Shift coefficient
Wa (j) (j =1, 2, . . . , Ls): Weighted coefficient
Ls: Maximum calculated length Fourth Embodiment In the fourth embodiment, there is provided a maximum likelihood sequence estimator for forming the equalizer 35 and sampling parts 34 in a receiver 30 as shown, for example, in FIG. 7. In this case, the embodiment is described with respect to the case for calculating a sampling phase τs, where the bit error rate is minimized, from optional sampling phase values in a sequence τ={τ(i)} (i=1, 2, . . . , M).

Figure 16A:
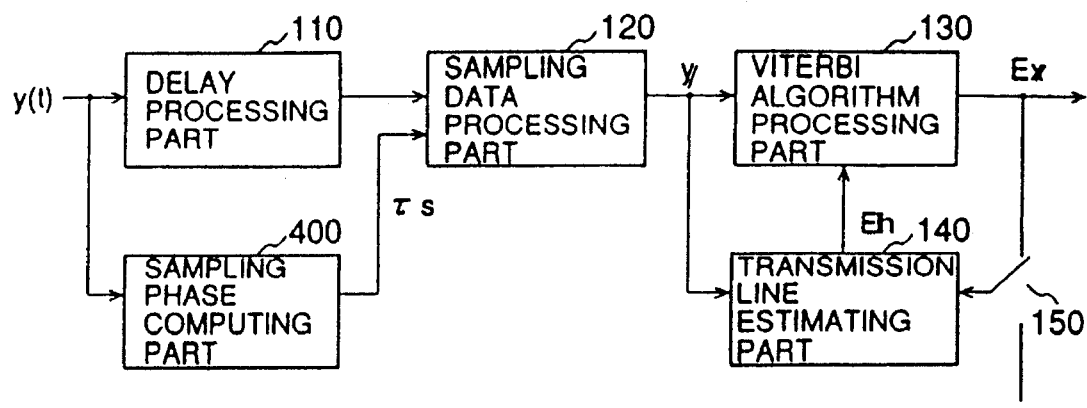
FIGS. 16(a) and 16(b) are diagrams showing a configuration of a maximum likelihood sequence estimator according to a fourth embodiment of the present invention.
Figure 16B:
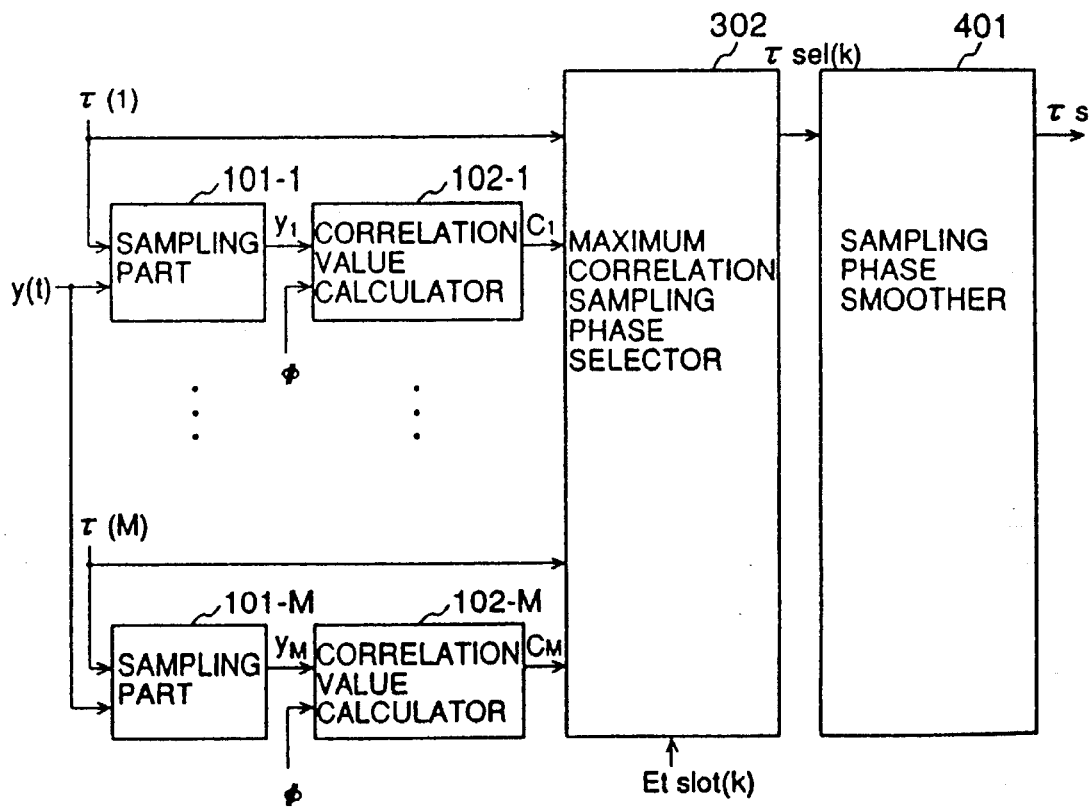

FIGS. 16(a) and 16(b) show a configuration of the maximum likelihood sequence estimator which is the fourth embodiment according to the present invention, wherein FIG. 16(a) is a functional block diagram of the whole maximum likelihood sequence estimator and FIG. 16(b) is a functional block diagram of a sampling phase calculating part shown in FIG. 16(a). The same components as those of the third embodiment are denoted by the same reference symbols.

The fourth embodiment differs from the third embodiment in that the configuration of the sampling phase smoother in the sampling phase calculating part differs from that of the third embodiment. The configuration of the sampling phase smoother 401 in the sampling phase calculating part 400 of the fourth embodiment is described below, referring to FIG. 16(b).

The sampling phase smoother 401 functions to obtain a first coordinate transformation term tc1 (k) and a second coordinate transformation term tc2 (i, k) for transforming the sampling phase to the coordinates in reference to the input timing of the reception signal in frame synchronization at a current time in accordance with the estimated leading time Et slot (k), from the frame synchronization mechanism 33 (refer to FIG. 7). The sampling phase smoother 401 functions to (1) obtain the sectional weighted mean value, the sectional maximum value and the sectional minimum value after adding the second coordinate transformation term tc2 (j, k) to the sampling phase τ sel (k) selected by the maximum correlation sampling phase selector 302, and (2) output the sampling phase τs obtained by adding a value, which is obtained by subtracting the sectional minimum value and the absolute values of the first coordinate transformation term tc1 (k) from the sectional maximum value and multiplying it by a constant, to the sectional weighted mean value.

The remainder of the configuration of the fourth embodiment shown in FIGS. 16(a) and 16(b) is the same as that of the third embodiment and therefore the description is omitted.

Figure 17:
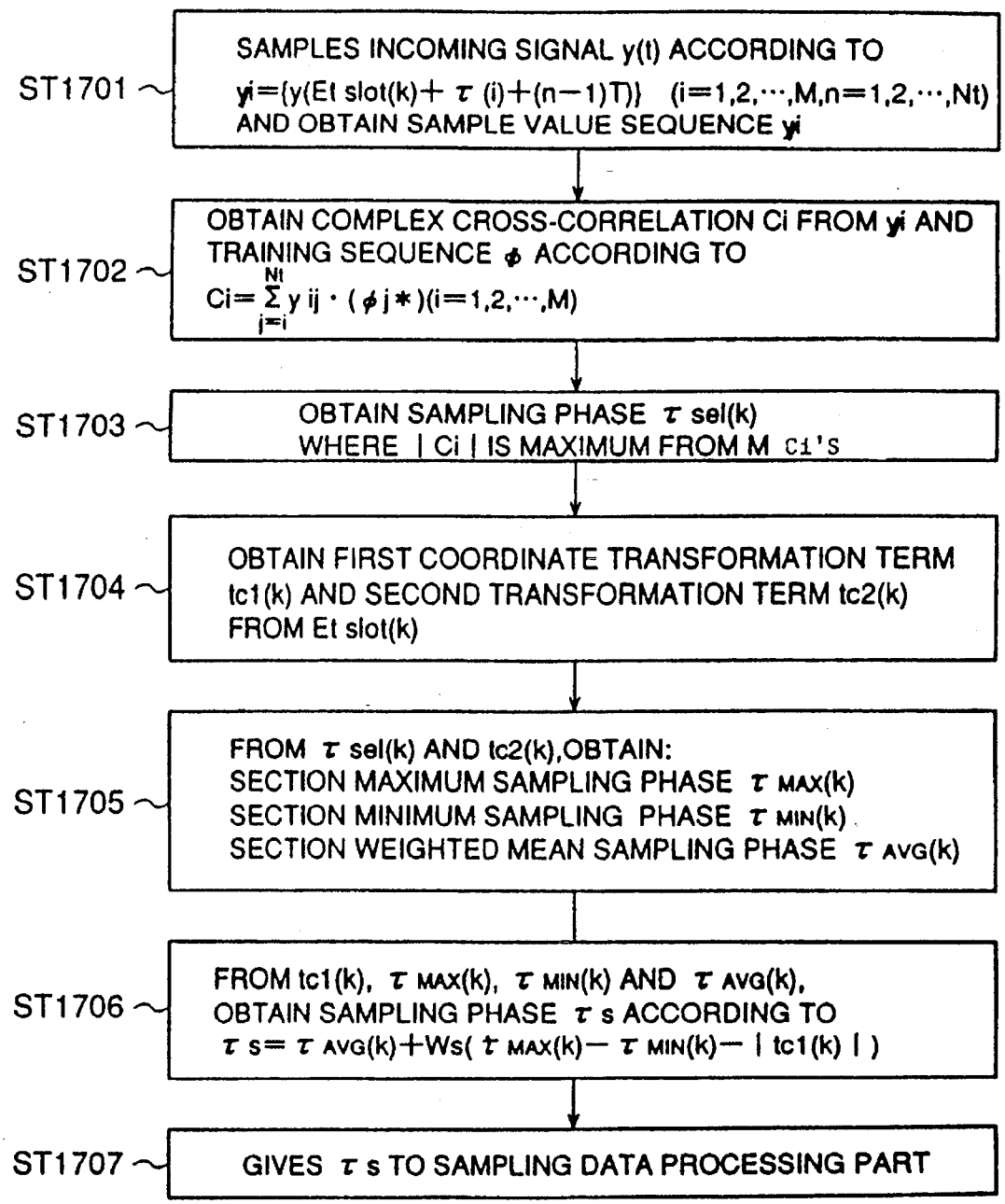
FIG. 17 is a flow chart showing operation of a sampling phase calculating part according to the fourth embodiment of the present invention.

FIG. 17 is a flow chart showing the operation of the sampling phase calculating part according to the fourth embodiment of the present invention.

The operation of the sampling phase calculating part 400 is described below, referring to FIGS. 17 and 16(b).

The sampling phase calculating part 400 of the fourth embodiment, as in the first embodiment, functions to obtain the complex cross-correlation function $c=\{C_i\}$ (i=1, 2, ..., M) from the reception signal y(t) and training sequence $\phi$ by the sampling parts 101-1~101-M and the correlation value calculators 102-1~102-M and give these functions to the maximum correlation sampling phase selector 302 (ST1701, ST1702).

When the maximum correlation sampling phase selector 302 selects a sampling phase $\tau$ sel (k) where the absolute values of correlation values $C_i$ are maximized and gives this selected sampling phase to the sampling phase smoother 401 as the sampling phase $\tau$ sel (k) which is selected in the kth selection of the sampling phase (ST1703), the sampling phase smoother 401 outputs the sampling phase $\tau s$ obtained according to the following equations (24)~(30) in the kth calculation (for the time segment k) of the sampling phase (ST1704~ST1707).

$$\Delta tc(k) = \begin{bmatrix} Et\,\text{slot}(k) - Et\,\text{slot}(k-1) & k > 1 \\ 0 & k \leq 1 \end{bmatrix} \quad (24)$$

$$\Delta tc1(k) = \begin{bmatrix} 0 & k \leq 1 \\ \sum_{i=1}^{k-1} \Delta tc(i+1) & k < Ls \\ \sum_{i=k-Ls}^{k-1} \Delta tc(i+1) & k \geq Ls \end{bmatrix} \quad (25)$$

$$\Delta tc2(j,k) = \begin{bmatrix} \sum_{i=j}^{k-1} \Delta tc(i+1) & j < k \\ 0 & j \geq k \end{bmatrix} \quad (26)$$

$$\tau\text{MAX}(k) = \begin{bmatrix} \max(\tau\,sel(j) + tc2(j,k)) & k < Ls \\ 1 \leq j \leq k \\ \max(\tau\,sel(j) + tc2(j,k)) & k \geq Ls \\ k - Ls + 1 \leq j \leq k \end{bmatrix} \quad (27)$$

$$\tau\text{MIN}(k) = \begin{bmatrix} \min(\tau\,sel(j) + tc2(j,k)) & k < Ls \\ k - Ls + 1 \leq j \leq k \\ \min(\tau\,sel(j) + tc2(j,k)) & k \geq Ls \\ k - Ls + 1 \leq j \leq k \end{bmatrix} \quad (28)$$

$$\tau\text{AVG}(k) = \quad (29)$$

$$\begin{bmatrix} \dfrac{\sum_{j=1}^{k-1}\{Wa(k-j+1)(\tau\,sel(i)+tc2(j,k))\}}{\sum_{j=1}^{k}Wa(j)} & k < Ls \\ \dfrac{\sum_{j=k-Ls+1}^{k}\{Wa(k-j+1)(\tau\,sel(i)+tc2(j,k))\}}{\sum_{j=1}^{Ls}Wa(j)} & k \geq Ls \end{bmatrix}$$

$$\tau s = \tau\text{AVG}(k) + Ws(\tau\text{MAX}(k) - \tau\text{MIN}(k) - |tc1(k)|) \quad (30)$$

where,

Ws: shift coefficient

Wa (j) (j=1, 2, ..., Ls): Weighted coefficient

Ls: Maximum calculation length

The reference point of the sampling phase selected in respective time slots according to timing compensation by the frame synchronization mechanism differs with each time slot. In calculations in the first embodiment for which the above point is not taken into account, the bit error rate in calculations for obtaining the sampling phase $\tau s$ may be adversely affected but, in the third and fourth embodiments, an adverse effect on calculations for obtaining the sampling phase $\tau s$ can be prevented.

The present invention is not limited to the above described embodiments and is contemplated with various modifications. Examples of such modifications are as described below.

(i) A matching filter and a matching filter for whitening can be added to the configurations of the maximum likelihood sequence estimator shown in, for example, FIGS. 1, 12, 14 and 16 and the output of this whitening filter can be entered into the Viterbi algorithm processing part 130. These configurations differ only in the arithmetic equations for path-metric values and therefore the above described embodiments can be similarly applied to the maximum likelihood sequence estimators with those configurations.

(ii) The sampling phase selecting parts described in respective embodiments can be composed of circuits other than shown in FIGS. 1(b), 12(b), 14(b) and 16(b). In addition, the embodiments are adapted to obtain the estimated values of transmission symbols by using the TDMA frame configuration shown in FIG. 6 but the above embodiments can be applied using other data sequences.

INDUSTRIAL APPLICABILITY

The present invention described above is adapted for use in land mobile communications equipment such as cordless telephone systems, automobile telephone systems, portable telephone systems, pocket type bells, simple land radio telephone systems, teleterminal systems, etc., maritime mobile communications equipment such as maritime mobile radio telephone systems, maritime satellite communications systems or aeronautical mobile communications systems such as air-borne public telephone, etc.

In addition, the present invention is also adapted for use in radio mobile telephone systems which are used by various public organizations, MCA land mobile radio communications systems, self-defense communications systems for taxi radio communications, specific small power radio stations and others.

What is claimed is:

1. A maximum likelihood sequence estimator for estimating, from a reception signal y(t) received from a transmission path during each of a plurality of time segments designatable by an index k (k=1, 2, ... ), a transmission symbol sequence $x=\{x_n\}$ containing a predetermined training sequence $\phi=\{\phi_n\}$ (n=1, 2, ..., Nt), comprising:

sampling means for sampling, during each of the time segments k, a training portion of the received reception signal y(t), the training portion corresponding to the predetermined training sequence $\phi=\{\phi_n\}$, said sampling means sampling the training portion at a symbol interval T at each of respective sampling phases of a sampling phase sequence[s] $\tau=\{\tau(i)\}$ (i=1, 2, ..., M), to obtain, for each of the sampling phases $\tau$ (i) (i=1, 2 ..., M) a corresponding sample value sequence[s] $y_i=\{y_{in}\}$ (n=1, 2, ..., Nt) of the reception signal y(t), correlation value calculating means for obtaining for each time segment k a complex cross-correlation function $c=\{C_i\}$ (i=1, 2, ..., M) of the sample value sequences $y_i$ (i=1, 2, ..., M) and the training sequence[s] $\phi=\{\phi_n\}$ (n=1, 2, ..., Nt), selecting means for obtaining for each time segment k from among the sampling phases of the sampling phase sequence $\tau=\{\tau(i)\}$ a selected sampling phase corresponding to a complex cross-correlation value Ci at which the absolute value of the cross-correlation function $c=\{Ci\}$ is maximum, by comparing the absolute values of the M number of complex cross-correlation values Ci, sampling phase smoothing means for obtaining for each time segment k a sampling phase $\tau s$ based on a plurality of the selected sampling phases obtained by said selecting means, a sampling processing part for sampling during each time segment k the reception signal y(t) entered at specified timings with respect to a symbol interval T and the sampling phase $\tau s$ to obtain a sample value sequence $y=\{yn\}$ (n=1, 2, ..., N), a transmission path estimating part for obtaining for each time segment k estimated values $E_h=\{Ehj\}$ (j=0, 1, ..., L) of the impulse response of the transmission path based on the sample value sequence $y$, and an operation processing part for obtaining for each time segment k estimated values $Ex=\{Exn\}$ (n=1, 2, ..., N) of the transmission symbol sequence $x$ from the sample value sequence $y$ based on the estimated values $E_h$.

2. A maximum likelihood sequence estimator as set forth in claim 1, wherein for each time segment k:

said selecting means obtains an index Ik corresponding to the selected sampling phase designated $\tau$ (Ik), where Ik represents the index of the sampling phase of the sampling phase sequence $\tau=\{\tau(i)\}$ obtained by said selecting means for the time segment k, and said sampling phase smoothing means obtains a weighted mean value, a maximum value and a minimum value of the index Ik, and obtains an index Is by (1) subtracting the minimum value from the maximum value to obtain a first resultant value, (2) multiplying the first resultant value by a constant to obtain a second resultant value, and (3) adding the second resultant value to the weighted mean value, the sampling phase $\tau s$ corresponding to the index Is.

3. A maximum likelihood sequence estimator as set forth in claim 2, wherein for each time segment k, said sampling phase smoothing means obtains the weighted mean value, the maximum value and the minimum value of the index Ik, over a predetermined set of the indexes obtained by said selecting means.

4. A maximum likelihood sequence estimator as set forth in claim 3, wherein for each time segment k:

said correlation value calculating means obtains the complex cross-correlation values Ci according to the following equation $$Ci = \sum_{j=1}^{Nt} yij(\phi j^*)$$

(where, i=1, 2, ..., M; * means that complex conjugation is used), and said sampling phase smoothing means obtains (1) the weighted mean value, the maximum value and the minimum value of the index Ik respectively as a sectional weighted mean value I avg (k), a sectional maximum value I max (k) and a sectional minimum value I min (k) of the index Ik, calculated according to the following equations at the time of obtaining the selected sampling phase for the time segment k by said selecting means:

$$I\max(k) = \begin{bmatrix} \max_{1 \leq j \leq k} Ij & k < Ls \\ \max_{k-Ls+1 \leq j \leq k} Ij & k \geq Ls \end{bmatrix}$$

$$I\min(k) = \begin{bmatrix} \min_{1 \leq j \leq k} Ij & k < Ls \\ \min_{k-Ls+1 \leq j \leq k} Ij & k \geq Ls \end{bmatrix}$$

$$I\text{avg}(k) = \begin{bmatrix} \dfrac{\sum_{j=1}^{k} \{Wa(k-j+1)Ij\}}{\sum_{j=1}^{k} Wa(j)} & k < Ls \\ \dfrac{\sum_{j=k-Ls+1}^{k} \{Wa(k-j+1)Ij\}}{\sum_{j=1}^{Ls} Wa(j)} & k \geq Ls \end{bmatrix}$$

(where, wa (j) (j=1, 2, ..., Ls) is a weighting coefficient and Ls denotes the maximum length of the calculation), (2) the selective sampling phase index Is according to the following equation:

$$Is = I\text{avg}(k) + Ws \ (I\max(k) - I\min(k))]$$

(where,

[ ] indicates in Gaussian notation the largest integer not exceeding the value in the brackets and Ws denotes a shift coefficient), and (3) the sampling phase $\tau s$ corresponding to the index Is, according to the following equation:

$$\tau s = \begin{bmatrix} \tau(1) & Is < 1 \\ \tau(Is) & 1 \leq Is \leq M \\ \tau(M) & M < Is. \end{bmatrix}$$

5. A maximum likelihood sequence estimator as set forth in claim 4, further comprising a delay processing part for delaying for a specific time duration the reception signal y(t) entered from the transmission path and outputting the delayed signal to said sampling processing part, wherein for each time segment k:

said sampling processing part samples the reception signal from said delay processing part, said transmission path estimating part processes a first part of the sample value sequence $y$ corresponding to the training sequence and a second part of the sample sequence $y$ other than the first part and obtains first estimated values $E_h=\{Ehj\}$ (j=0, 1, ..., L) of the impulse response of the transmission path from the sample value sequence $y$ and the training sequence $\phi$, according to an adaptive equalization algorithm, in processing of the first part of the sample value sequence $y$, said transmission math estimating part obtains second estimated values $E_h$ from the sample value sequence 𝒴 and the estimated values E𝒳={Exn} (n=1, 2, ..., N) of the transmission symbol sequence according to the adaptive equalization algorithm, in processing of the second part of the sample value sequence 𝒴, and said operation processing part obtains the estimated values E𝒳 according to the Viterbi algorithm.

6. A maximum likelihood sequence estimator as set forth in claim 2, wherein the sampling phase sequence $\tau=\{\tau(i)\}$ is a simple non-increasing or simple non-decreasing sampling phase sequence and wherein for each time segment k:

said correlation value calculating means obtains the complex cross-correlation values Ci according to the following equation:

$$Ci = \sum_{j=1}^{Nt} yij(\phi j^*)$$

(where, i=1, 2, ..., M; * means that complex conjugation is used), and said sampling phase smoothing means obtains (1) the weighted mean value, maximum value and minimum value of the index Ik respectively as a weighted mean value I AVG (k), a maximum value I MAX (k) and a minimum value I MIN (k) of the index Ik, calculated according to the following equations at the time of obtaining the selected sampling phase for the time segment k by said selecting means:

$$I\,MAX(k) = \max_{1 \leq j \leq k} Ij$$

$$I\,MIN(k) = \min_{1 \leq j \leq k} Ij$$

$$I\,AVG(k) = (1 - \alpha)\,I\,AVG(k - 1) + \alpha Ik\,(\alpha: \text{constant})$$

$$I\,AVG(0) = 0,$$

(2) a selective sampling phase index Is according to the following equation:

$$Is = [I\,AVG\,(k) + Ws\,(I\,MAX\,(k) - I\,MIN\,(k))]$$

(where,

[ ] indicates in Gaussian notation the largest integer not exceeding the value in the brackets and ws denotes a shift coefficient), and (3) the sampling phase τs corresponding to the index Is according to the following equation:

$$\tau s = \begin{cases} \tau(1) & Is < 1 \\ \tau(Is) & 1 \leq Is \leq M \\ \tau(M) & M < Is. \end{cases}$$

7. A maximum likelihood sequence estimator as set forth in claim 6, further comprising a delay processing part for delaying for a specified time duration the reception signal entered from the transmission path and outputting the delayed signal to said sampling processing part, wherein for each time segment k:

said sampling processing part samples the reception signal from said delay processing part, said transmission math estimating part processes a first part of the sample value sequence 𝒴 corresponding to the training sequence and a second part of the sample sequence 𝒴 other than the first part and obtains first estimated values E$_h$={Ehj} (j=0, 1, ..., L) of the impulse response of the transmission path from the sample value sequence 𝒴 and the training sequence $\phi$, according to an adaptive equalization algorithm, in processing of the first part of the sample value sequence 𝒴, said transmission path estimating part obtains second estimated values E$_h$ from the sample value sequence 𝒴 and the estimated values E𝒳={Exn} (n=1, 2, ..., N) of the transmission symbol sequence according to the adaptive equalization algorithm, in processing of the second part of the sample value sequence 𝒴, and said operation processing part obtains the estimated values E𝒳 according to the Viterbi algorithm.

8. A maximum likelihood sequence estimator as set forth in claim 1, wherein the time segments k are non-overlapping.

9. A maximum likelihood sequence estimator as set forth in claim 1, wherein for each time segment k said sampling phase smoothing means obtains a sectional weighted mean value, a sectional maximum value and a sectional minimum value, all of a sampling phase τsel (k) obtained as the selected sampling phase by said selecting means, and obtains the sampling phase τs based on the sectional weighted mean value, the sectional maximum value and the sectional minimum value.

10. A maximum likelihood sequence estimator as set forth in claim 9, wherein for each time segment k:

said sampling means samples the reception signal at the symbol interval T, starting from an estimated leading time determined by a frame synchronization mechanism, said sampling phase smoothing means obtains a coordinate transformation term in accordance with the estimated leading time, adds the coordinate transformation term to the sampling phase τsel (k), obtains the sectional weighted mean value, the sectional maximum value and the sectional minimum value of the sampling phase τsel (k) after adding the coordinate transformation term to the sampling phase τsel (k), and calculates the sampling phase τs by respectively subtracting from and adding to the sectional weighted mean value, the coordinate transformation term and a second resultant value, the second resultant value being obtained by (1) subtracting the absolute value of the coordinate transformation term, and the sectional minimum value, from the sectional maximum value to obtain a first resultant value, and (2) multiplying the first resultant value by a constant to obtain the second resultant value.

11. A maximum likelihood sequence estimator as set forth in claim 10, wherein for each time segment k:

said sampling means samples the reception signal entered from the transmission path, at the symbol interval T at each of the respective sampling phases of the sampling phase sequence $\tau=\{\tau(i)\}$ (i=1, 2, ..., M), starting from an estimated leading time Et slot (k) of the time segment k determined by a frame synchronization mechanism when processing the time segment k to obtain the sample value sequences 𝒴i ={yin} (i=1, 2, ..., M; n=1, 2, ..., Nt) of the reception signal, said correlation value calculating means obtains the complex cross-correlation values Ci according to the following equation:

$$Ci = \sum_{j=1}^{Nt} yij(\phi j^*)$$

(where, $i=1, 2, \ldots, M$; * means that complex conjugation is used), and said sampling phase smoothing means obtains (a) the coordinate transformation term as a coordinate transformation term tc (k), according to the equations given below:

$$\Delta tc(k) = Et\,slot(k) - Et\,slot(k-1) \quad k > 1$$

$$tc(k) = \begin{cases} \sum_{i=1}^{k-1} \Delta tc(i) & k > 1 \\ 0 & k = 1, \end{cases}$$

(b) the sectional weighted mean value, the sectional maximum value and the sectional minimum value respectively as a sectional weighted mean value $\tau\,avg$ (k), a sectional maximum value $\tau\,max$ (k) and a sectional minimum value $\tau\,min$ (k) of the sampling phase $\tau sel$ (k), according to the following equations:

$$\tau\,max(k) = \begin{cases} max(\tau\,sel(j) + tc(j)) & k < Ls \\ 1 \leq j \leq k \\ max(\tau\,sel(j) + tc(j)) & k \geq Ls \\ k - Ls + 1 \leq j \leq k \end{cases}$$

$$\tau\,min(k) = \begin{cases} min(\tau\,sel(j) + tc(j)) & k < Ls \\ 1 \leq j \leq k \\ min(\tau\,sel(j) + tc(j)) & k \geq Ls \\ k - Ls + 1 \leq j \leq k \end{cases}$$

$$\tau\,avg(k) = \begin{cases} \dfrac{\sum_{j=1}^{k} \{Wa(k-j+1)(\tau\,sel(j) + tc(j))\}}{\sum_{j=1}^{k} Wa(j)} & k < Ls \\ \\ \dfrac{\sum_{j=k-Ls+1}^{k} \{Wa(k-j+1)(\tau\,sel(j) + tc(j))\}}{\sum_{j=1}^{Ls} Wa(j)} & k \geq Ls \end{cases}$$

(where,

Wa (j) ($j=1, 2, \ldots, Ls$) is a weighting coefficient and Ls denotes the maximum calculation length), and (c) the selective sampling phase $\tau s$ according to the following equation:

$$\tau s = \tau avg\,(k) - tc(k) + ws(\tau max\,(k) - \tau min\,(k) - |tc(k)|)$$

(where, ws indicates the shift coefficient, wa (j) ($j=1, 2, \ldots, Ls$) is a weighting coefficient and Ls denotes the maximum calculation length).

12. A maximum likelihood sequence estimator as set forth in claim 11, further comprising a delay processing part for delaying for a specified time duration the reception signal entered from the transmission path and outputting the delayed signal to said sampling processing part, wherein for each time segment k:

said sampling phase sequence $\tau = \{\tau(i)\}$ ($i=1, 2, \ldots, M$) in said sampling means are simple non-increasing or simple non-decreasing, said sampling processing part samples the reception signal from said delay processing part, said transmission path estimating part processes a first part of the sample value sequence $y$ corresponding to the training sequence and a second part of the sample sequence $y$ other than the first part and obtains first estimated values $E_h = \{Ehj\}$ ($j=0, 1, \ldots, L$) of the impulse response of the transmission path from the sample value sequence $y$ and the training sequence $y$, according to an adaptive equalization algorithm, in processing of the first part of the sample value sequence $y$, said transmission path estimating part obtains second estimated values $E_h$ from the sample value sequence $y$ and the estimated values $Ex = \{Exn\}$ ($n=1, 2, \ldots, N$) of the transmission symbol sequence $x$ according to the adaptive equalization algorithm, in processing of the second part of the sample value sequence $y$, and said operation processing part obtains the estimated values $Ex$ according to the Viterbi algorithm.

13. A maximum likelihood sequence estimator as set forth in claim 9, wherein for each time segment k:

said sampling means samples the reception signal at the symbol interval T, starting from an estimated leading time determined by a frame synchronization mechanism, and said sampling phase smoothing means obtains first and second coordinate transformation terms in accordance with the estimated leading time, adds the second coordinate transformation term to the sampling phase $\tau sel$ (k), obtains the sectional weighted mean value, sectional maximum value and sectional minimum value of the sampling phase $\tau sel$ (k) after adding the second coordinate transformation term to the sampling phase $\tau sel$ (k), and calculates the sampling phase $\tau s$ by respectively subtracting the sectional minimum value and the absolute value of the first coordinate transformation term from the sectional maximum value to obtain a first resultant value, multiplying the first resultant value by a constant to obtain a second resultant value, and adding the second resultant value to the sectional weighted mean value.

14. A maximum likelihood sequence estimator as set forth in claim 13, wherein for each time segment k:

said sampling means samples the reception signal entered from the transmission path, at the symbol interval T at each of the respective sampling phases of the sampling phase sequence $\tau = \{\tau(i)\}$ ($i=1, 2, \ldots, M$), starting from the estimated leading time Et slot (k) of the time segment k determined by the frame synchronization mechanism when processing the time segment k to obtain the sample value sequences $yi = \{yin\}$ ($i=1, 2, \ldots, M$; $n=1, 2, \ldots, Nt$) of the reception signal y(t), said correlation value calculating means obtains the complex cross-correlation values Ci according to the following equation:

$$Ci = \sum_{j=1}^{Nt} yij(\phi j^*)$$

(where, i=1, 2, ..., M; * means that complex conjugation is used), and said sampling phase smoothing means obtains (a) the first and second coordinate transformation terms, respectively as a first coordinate transformation term tc1 (k) and a second coordinate transformation term tc2 (j, k), according to the following equations at the time of obtaining the selected sampling phase for the time segment k by said selecting means:

$$\Delta tc(k) = \begin{bmatrix} Et\,slot(k) - Et\,slot(k-1) & k > 1 \\ 0 & k \leq 1 \end{bmatrix}$$

$$tc1(k) = \begin{bmatrix} 0 & k \leq 1 \\ \sum_{i=1}^{k-1} \Delta tc(i+1) & 1 < k < Ls \\ \sum_{i=k-Ls}^{k-1} \Delta tc(i+1) & k \geq Ls \end{bmatrix}$$

$$tc2(j,k) = \begin{bmatrix} \sum_{i=j}^{k-1} \Delta tc(i+1) & j < k \\ 0 & j \geq k, \end{bmatrix}$$

(b) the sectional weighted mean value, the sectional maximum value and the sectional minimum value, respectively as a sectional weighted mean value τAVG (k), a sectional maximum value τMAX (k) and a sectional minimum value τMIN (k) of the sampling phase τsel (k), according to the following equations:

$$\tau MAX(k) = \begin{bmatrix} \max(\tau\,sel(j) + tc2(j,k)) & k < Ls \\ 1 \leq j \leq k \\ \max(\tau\,sel(j) + tc2(j,k)) & k \geq Ls \\ k - Ls + 1 \leq j \leq k \end{bmatrix}$$

$$\tau MIN(k) = \begin{bmatrix} \min(\tau\,sel(j) + tc2(j,k)) & k < Ls \\ 1 \leq j \leq k \\ \min(\tau\,sel(j) + tc2(j,k)) & k \geq Ls \\ k - Ls + 1 \leq j \leq k \end{bmatrix}$$

$$\tau AVG(k) =$$

$$\begin{bmatrix} \dfrac{\sum_{j=1}^{k} \{Wa(k-j+1)(\tau\,sel(j) + tc2(j,k))\}}{\sum_{j=1}^{k} Wa(j)} & k < Ls \\ \dfrac{\sum_{j=k-Ls+1}^{k} \{Wa(k-j+1)(\tau\,sel(j) + tc2(j,k))\}}{\sum_{j=1}^{Ls} Wa(j)} & k \geq Ls \end{bmatrix}$$

(where, wa (j) (j=1, 2, ..., Ls) is a weighting coefficient and Ls denotes the maximum calculation length), and (c) the selective sampling phase τs according to the following equation:

$$\tau s = \tau AVG\,(k) + ws(\tau MAX\,(k) - \tau MIN\,(k) - |tc1(k)|)$$

(where, ws indicates the shift coefficient.

15. A maximum likelihood sequence estimator as set forth in claim 14, further comprising a delay processing part for delaying for a specified time duration the reception signal entered from the transmission path and outputting the delayed signal to said sampling processing part, wherein for each time segment k:

the sampling phase sequence $\tau=\{\tau(i)\}$ (i=1, 2, ..., M) in said sampling means is a simple non-increasing or simple non-decreasing sequence, said sampling processing part samples the reception signal from said delay processing part, said transmission math estimating part processes a first part of the sample value sequence $y$ corresponding to the training sequence and a second mart of the sample sequence $y$ other than the first part and obtains first estimated values $E_h=\{Ehj\}$ (j=0, 1, ..., L) of the impulse response of the transmission path from the sample value sequence $y$ and the training sequence $\phi$ according to an adaptive equalization algorithm, in processing of the first part of the sample value sequence $y$, said transmission math estimating part obtains second estimated values $E_h$ from the sample value sequence $y$ and the estimated values $Ex=\{Exn\}$ (n=1, 2, ..., N) of the transmission symbol sequence $x$ according to the adaptive equalization algorithm, in processing of the second part of the sample value sequence $y$, and said operation processing part obtains the estimated values $Ex$ according to the Viterbi algorithm.

16. A maximum likelihood sequence estimating method for estimating, from a reception signal y(t) received from a transmission oath during each of a plurality of time segments designatable by an index k (k=1, 2, ...), a transmission symbol sequence $x=\{xn\}$ containing a predetermined training sequence $\phi=\{\phi n\}$ (n=1, 2, ..., Nt), comprising the steps of:

a. obtaining, during each of the time segment k, sample value sequences $yi =\{yin\}$ (i=1, 2, ..., M; n=1, 2, ..., Nt) of a training portion of the received reception signal y(t) provided from the transmission path, by sampling the reception signal at a symbol interval T at each of respective sampling phases of a sampling phase sequence $\tau=\{\tau(i)\}$ (i=1, 2, ..., M), and outputting the sample value sequences $yi$, the training portion corresponding to the predetermined training sequence $\phi$, b. obtaining for each time segment k a complex cross-correlation function $c=\{Ci\}$ (i=1, ..., M) of the sample value sequences $yi$ and the training sequence $\phi$, where Ci designates a complex cross-correlation value corresponding to the complex cross-correlation of the sample value sequences $yi$ and the training sequence $\phi$, c. obtaining for each time segment k from among the sampling phases of the sampling phase sequence $\{\tau(i)\}$ a sampling phase $\tau$ (Ik) corresponding to the complex cross-correlation value Ci at which the absolute value of the cross-correlation function $c=\{Ci\}$ is maximum, by comparing the absolute values of the M number of complex cross-correlation values Ci, d. obtaining and outputting for each time segment k an index Ik of the sampling phase $\tau$(Ik), e. obtaining for each time segment k a sectional weighted mean value, a sectional maximum value and a sectional minimum value, of the index Ik, f. obtaining for each time segment k an index Is by adding to the sectional weighted mean value a value obtained by subtracting the sectional minimum value from the maximum value and multiplying a resultant value by a constant, g. outputting for each time segment k the sampling phase τs corresponding to the index Is, h. obtaining for each time segment k a sample value sequence 𝒴={yn} (n=1, 2, ..., N) by sampling the reception signal provided at specified timings with respect to the symbol interval T and the sampling phase τs, and outputting the sample value sequence 𝒴={yn} (n=1, 2, ..., N), i. obtaining for each time segment k estimated values E𝐡={Ehj} (j=0, 1, ..., L) of the impulse response of the transmission path based on the sample value sequence 𝒴, and outputting the estimated values E𝐡, and j. obtaining for each time segment k estimated values E𝒳={Exn} (n=1, 2, ..., N) of a transmission symbol sequence 𝒳 from the sample value sequence 𝒴 based on the estimated values E𝐡, and outputting the estimated values e𝒳.

17. A maximum likelihood sequence estimating method as set forth in claim 16, wherein the sectional weighted mean value, the sectional maximum value and the sectional minimum value of the index Ik are obtained every predetermined section.

18. A maximum likelihood sequence estimating method as set forth in claim 16, wherein for time segments k, k≧Ls, where Ls is a predetermined maximum calculation length, said step of obtaining the sectional weighted mean value, the sectional maximum value and the sectional minimum value of the index Ik, includes obtaining the sectional weighted mean value, the sectional maximum value and the sectional minimum value, all of the index Ik, based on the values of the indices Ij, k−Ls≦j≦k.

19. A maximum likelihood sequence estimating method as set forth in claim 16, wherein the time segments k are non-overlapping.

20. A maximum likelihood sequence estimating method for estimating, from a reception signal y(t) received from a transmission path during each of a plurality of time segments designatable by an index k (k=1, 2, ... ), a transmission symbol sequence 𝒳={xn} containing a predetermined training sequence φ={φn} (n=1, 2, ..., Nt), comprising the steps of:

obtaining, during each of the time segments k, sample value sequences 𝒴i={yin} (i=1, 2, ..., M; n=1, 2, ..., Nt) of a training portion of the received reception signal y(t), by sampling the reception signal during each of the time segments k, at a symbol interval T at each of respective sampling phases of a sampling phase sequence τ={τ(i)} (i=1, 2, ..., M), the training portion corresponding to the predetermined training sequence, and obtaining for each time segment k a complex cross-correlation function 𝒸={Ci} (i=1, 2, ..., M) of the sample value sequence 𝒴i and the training sequence φ, where Ci designates a complex cross-correlation value corresponding to the complex cross-correlation of the sample value sequences 𝒴i and the training sequence φ, obtaining for each time segment k from among the sampling phases of the sampling phase sequence τ={τ} a sampling phase τsel (k) corresponding to a complex cross-correlation value Ci at which the absolute value of the cross-correlation function 𝒸={Ci} is maximum, by comparing the absolute values of the M number of complex cross-correlation values Ci, obtaining for each time segment k a sampling phase τs based on a sectional weighted mean value, a sectional maximum value and a sectional minimum value, all of the sampling phase τsel (k), obtaining for each time segment k a sample value sequence 𝒴={yn} (n=1, 2, ..., N) by sampling the reception signal at specified timings with respect to the symbol interval T and the sampling phase τs, starting from an estimated leading time, obtaining for each time segment k estimated values E𝐡={Ehj} (j=0, 1, ..., L) of the impulse response of the transmission path based on both the sample value sequence 𝒴 and the training sequence φ, and obtaining for each time segment k estimated values E𝒳 from the sample value sequence 𝒴 based on the estimated values E𝐡.

21. A maximum likelihood sequence estimating method as set forth in claim 20, wherein for each time segment k:

the sample value sequences 𝒴={yin} (i=1, 2, ..., M; n=1, 2, ..., Nt) of the reception signal are sampled and obtained at the symbol interval T, starting from the estimated leading time, wherein she estimated leading time is determined by a frame synchronization mechanism, and said step of obtaining a sampling phase τs includes obtaining a coordinate transformation term in accordance with the estimated leading time, adding the coordinate transformation term to the sampling phase τsel (k), and obtaining the sectional weighted mean value, the sectional maximum value and the sectional minimum value based on the sum of the coordinate transformation term and the sampling phase τsel (k), subtracting the sectional minimum value and the absolute value of the coordinate transformation term from the sectional maximum value to obtain a first resultant value, multiplying the first resultant value by a constant to obtain a second resultant value, and adding the second resultant value to, and subtracting the coordinate transformation term from, the sectional weighted mean value, thereby to obtain the sampling phase τs.

22. A maximum likelihood sequence estimating method as set forth in claim 20, wherein for each time segment k:

the sample value sequences 𝒴={yin} (i=1, 2, ..., M; n=1, 2, ..., Nt) of the reception signal y(t) are sampled and obtained at the symbol interval T, starting from the estimated leading time, wherein the estimated leading time is determined by a frame synchronization mechanism, and said step of obtaining the sampling phases τs includes obtaining first and second coordinate transformation terms in accordance with the estimated leading time, determining the sum of the second coordinate transformation term and the sampling phase τsel (k) after said step of obtaining the first and second coordinate transformation terms, and obtaining the sectional weighted mean value, the sectional maximum value and the sectional minimum value based on the sum, and subtracting the absolute value of the first coordinate transformation term and the sectional minimum value from the sectional maximum value to obtain a first resultant value, multiplying the first resultant value by a constant to obtain a second resultant value, and adding the second resultant value to the sectional weighted mean value to obtain the sampling phase τs.

23. A maximum likelihood sequence estimating method as set forth in claim 20, wherein for time segments k, k≧Ls, where Ls is a predetermined maximum calculation length, said step of obtaining the sampling phase τs includes obtaining the sectional weighted mean value, the sectional maximum value and the sectional minimum value all of the sampling phase τsel (k), based on the values of the sampling phases τsel (j), k–Ls≦j≦K.

24. A maximum likelihood sequence estimating method as set forth in claim 20, wherein the time segments k are non-overlapping.

25. A maximum likelihood sequence estimating method for estimating, from a reception signal y(t) received from a transmission path during each of a plurality of time segments designarable by an index k (k=1, 2, . . . ), a transmission symbol sequence $\mathscr{X}=\{xn\}$ containing a predetermined training sequence $\phi=\{\phi n\}$ (n=1, 2, . . . , Nt), comprising the steps of:

a. sampling the received reception signal, during each of the time segments k, at a symbol interval T at each of respective sampling phases of a simple non-increasing or simple non-decreasing sampling phase sequence τ={τ(i)} (i=1, 2, . . . , M), b. obtaining for each time segment k, from the sampling in said step a, sample value sequences $\mathscr{Y}i=\{yin\}$ (I=1, 2, . . . , M; n=1, 2 . . . Nt) of the reception signal, c. obtaining for each time segment k complex cross-correlation values Ci of a complex cross-correlation function $c=\{Ci\}$ (i=1, 2, . . . , M) of the sample value sequences $\mathscr{Y}i$ and the training sequence $\phi$, according to the following equation:

$$Ci = \sum_{j=1}^{Nt} yij(\phi j^*)$$

(where, i=1, 2 . . . , M; * means that complex conjugation is used), d. obtaining for each time segment k, from among tho sampling phases of the sampling phase sequence τ={τ(i)}, a selected sampling phase τ (Ik) corresponding to the complex cross-correlation value Ci at which the absolute value of the cross-correlation function $c=\{Ci\}$ is maximum by comparing the absolute values of the M number of complex cross-correlation values Ci, e. obtaining for each time segment k a weighted mean value I AVG (k), a maximum value I MAX (k) and a minimum value I MIN (k), all of the index Ik of the sampling phase τ (Ik), according to the following equations at the time of the selection of the selected sampling phase in said step d for the time segment k:

$$I\ MAX\ (k) = \max_{1 \leq j \leq k} Ij$$

-continued $$I\ MIN\ (k) = \min_{1 \leq j \leq k} Ij$$

$I\ AVG\ (k) = (1 - \alpha)\ I\ AVG\ (k - 1) + \alpha Ik$ (α: constant)

$I\ AVG\ (0) = 0$, f. obtaining for each time segment k a selective sampling phase index Is according to the following equation:

$Is=[I\ AVG\ (k)+ws\ (I\ MAX\ (k)–I\ MIN\ (k))]$ (where,

[ ] indicates in Gaussian notation the largest integer which does not exceed the value in the brackets and ws denotes a shift coefficient), g. obtaining for each time segment k a sampling phase τs corresponding to the index Is, according to the following equation:

$$\tau s = \begin{bmatrix} \tau(1) & Is < 1 \\ \tau(Is) & 1 \leq Is < \leq M \\ \tau(M) & M < Is, \end{bmatrix}$$

h. obtaining for each time segment k a sample value sequence $\mathscr{Y}=\{yn\}$ (n=1, 2, . . . , N) by sampling the reception signal at a symbol interval T and the sampling phase τs, i. processing a first part of the sample value sequence $\mathscr{Y}$ corresponding to the training sequence $\phi$ and a second part of the sample sequence y other than the first part, including obtaining for each time segment k first estimated values $E_h=\{Ehj\}$ (j=0, 1, . . . , L) of the impulse response of the transmission path from the first part of the sample value sequence $\mathscr{Y}$ and the training sequence $\phi$ according to an adaptive equalization algorithm, and obtaining for each time segment k second estimated values $E_h$ from the second part of the sample value sequence $\mathscr{Y}$ and estimated values $E\mathscr{X}=\{Exn\}$ (n=1, 2, . . . , N) of the transmission symbol sequence $\mathscr{X}$, according to the adaptive equalization algorithm, and j. obtaining for each time segment k the estimated values $E\mathscr{X}$ from the sample value sequence $\mathscr{Y}$ based on the first and second estimated values $E_h$, according to the Viterbi algorithm.

26. A maximum likelihood sequence estimating method for estimating, from a reception signal y(t) received from a transmission path during each of a plurality of time segments designarable by an index k (k=1, 2, . . . ), a transmission symbol sequence $\mathscr{X}=\{xn\}$ containing a predetermined training sequence $\phi=\{\phi n\}$ (n=1, 2, . . . , Nt), comprising the steps of:

a. sampling the reception signal, during each of the time segments k, at a symbol interval T at each of respective sampling phases of a simple non-increasing or simple non-decreasing sampling phase sequence τ={τ(i)} (i=1, 2, . . . , M), b. obtaining for each time segment k, from the sampling in said stem a, sample value sequences $\mathscr{Y}i=\{yin\}$ (i=1, 2, . . . , M; n=1, 2, . . . , Nt) of the reception signal y(t), c. obtaining for each time segment k complex cross-correlation values Ci of a complex cross-correlation functions $c=\{Ci\}$ (i=1, 2, . . . , M) of the training sequence $\phi$ and the sample value sequences $y$, according to the following equation:

$$Ci = \sum_{j=1}^{Nt} yij(\phi j^*)$$

(where, i=1, 2 ..., M; * means that complex conjugation is used), d. obtaining for each time segment k from among the sampling phases of the sampling phase sequence $\tau=\{\tau(i)\}$, a selected sampling phase $\tau$ (Ik) corresponding to the complex cross-correlation value Ci at which the absolute value of the cross-correlation function $c=\{Ci\}$ is maximum, by comparing the absolute values of the M number of complex cross-correlation values Ci, e. obtaining for each time segment k a weighted mean value I avg (k), a maximum value I max (k) and a minimum value I min (k), all of the index Ik, according to the following equations at the time of obtaining the selected sampling phase in said step d for the time segment k:

$$I\max(k) = \begin{bmatrix} \max_{1 \leq j \leq k} Ij & k < Ls \\ \max_{k-Ls+1 \leq j \leq k} Ij & k \geq Ls \end{bmatrix}$$

$$I\min(k) = \begin{bmatrix} \min_{1 \leq j \leq k} Ij & k < Ls \\ \min_{k-Ls+1 \leq j \leq k} Ij & k \geq Ls \end{bmatrix}$$

$$I\text{avg}(k) = \begin{bmatrix} \dfrac{\sum_{j=1}^{k} \{Wa(k-j+1)Ij\}}{\sum_{j=1}^{k} Wa(j)} & k < Ls \\ \dfrac{\sum_{j=k-Ls+1}^{k} \{Wa(k-j+1)Ij\}}{\sum_{j=1}^{Ls} Wa(j)} & k \geq Ls \end{bmatrix}$$

(where, wa (j) (j=1, 2 ..., Ls) is a weighting coefficient and Ls denotes the maximum length of the calculation), f. obtaining for each time segment k a selective sampling phase index Is according to the following equation:

$$Is = [I\text{ avg }(k) + ws\,(I\max(k) - I\min(k))]$$

(where,

[ ] indicates in Gaussian notation the largest integer which does not exceed the value in the brackets and ws denotes a shift coefficient), g. obtaining for each time segment k a sampling phase $\tau s$ corresponding to the index Is, according to the following equation:

$$\tau s = \begin{bmatrix} \tau(1) & Is < 1 \\ \tau(Is) & 1 \leq Is < \leq M \\ \tau(M) & M < Is, \end{bmatrix}$$

h. obtaining for each time segment k a sample value sequence $y=\{yn\}$ (n=1, 2, ..., N) by sampling the reception signal y(t) at the symbol interval T and the sampling phase $\tau s$, i. processing a first part of the sample value sequence $y$ corresponding to the training sequence and a second part of the sample sequence $y$ other than the first part, including obtaining for each time segment k first estimated values $E_h = \{Ehj\}$ (j=0, 1, ..., L) of the impulse response of the transmission path from the first part of the sample value sequence $y$ and the training sequence $\phi$ according to an adaptive, and obtaining for each time segment k second estimated values $E_h$ from the second part of the sample value sequence $y$ and estimated values $Ex=\{Exn\}$ (n=1, 2, . . . , N) of the transmission symbol sequence $x$, according to the adaptive equalization algorithm, and j. obtaining for each time segment k the estimated values $Ex$ from the sample value sequence $y$ based on the first and second estimated values $E_h$, according to the Viterbi algorithm.

27. A maximum likelihood sequence estimating method for estimating, from a reception signal y(t) received from transmission path during each of a plurality of time segments designatable by an index k (k=1, 2, ... ), a transmission symbol sequence $x=\{xn\}$ containing a predetermined training sequence $\phi=\{\phi n\}$ (n=1, 2, ..., Nt),, comprising the steps of:

a. during each of the time segments k sampling the reception signal y(t) at a symbol interval T at each of respective sampling phases of a sampling phase sequence $\tau=\{\tau(i)\}$ (i=1, 2, ..., M), starting from an estimated leading time Et slot (k) of the time segment k determined by a frame synchronization mechanism, b. obtaining, for each time segment k from the sampling of said step a, sample value sequences $yi = \{yin\}$ (i=1, 2, ..., M; n=1, 2, ..., Nt) of the reception signal y(t), c. obtaining for each time segment k a complex cross-correlation function $c=\{Ci\}$ (i=1, ..., M) of the training sequence $\phi$ and the sample value sequences $yi$, where Ci designates a complex cross-correlation value corresponding to the complex cross-correlation of the sample value sequences $yi$ and the training sequence $\phi$, according to the following equation:

$$Ci = \sum_{j=1}^{Nt} yij(\phi j^*)$$

(where, i=1, 2, ..., M; * means that complex conjugation is used), d. obtaining for each time segment k from among the sampling phases of the sampling phase sequence $\tau=\{\tau(i)\}$, a sampling phase $\tau sel$ (k), corresponding to the complex cross-correlation value Ci at which the absolute value of the cross-correlation function $c=\{Ci\}$ is maximum, by comparing the absolute values of the M number of complex cross-correlation values Ci, e. obtaining for each time segment k a coordinate transformation term tc (k) according to the equations given below:

$$\Delta tc(k) = Et\,\text{slot}(k) - Et\,\text{slot}(k-1) \quad k > 1$$

-continued $$tc(k) = \begin{cases} \sum_{i=1}^{k-1} \Delta tc(i) & k > 1 \\ 0 & k = 1, \end{cases}$$

f. obtaining for each time segment k a sectional weighted mean value τ avg (k), a sectional maximum value τ max (k) and a sectional minimum value τ min (k), all of the sampling phase τsel (k), according to the following equations:

$$\tau \max(k) = \begin{cases} \max(\tau\, sel(j) + tc(j)) & k < Ls \\ 1 \leq j \leq k \\ \max(\tau\, sel(j) + tc(j)) & k \geq Ls \\ k - Ls + 1 \leq j \leq k \end{cases}$$

$$\tau \min(k) = \begin{cases} \min(\tau\, sel(j) + tc(j)) & k < Ls \\ 1 \leq j \leq k \\ \min(\tau\, sel(j) + tc(j)) & k \geq Ls \\ k - Ls + 1 \leq j \leq k \end{cases}$$

τ avg(k) =

$$\begin{cases} \dfrac{\sum_{j=1}^{k} \{Wa(k-j+1)(\tau\,sel(j) + tc(j))\}}{\sum_{j=1}^{k} Wa(j)} & k < Ls \\ \dfrac{\sum_{j=k-Ls+1}^{k} \{Wa(k-j+1)(\tau\,sel(j) + tc(j))\}}{\sum_{j=1}^{Ls} Wa(j)} & k \geq Ls \end{cases}$$

(where, wa (j) (j=1, 2 . . . , Ls) is a weighting coefficient and Ls denotes the maximum calculation length), g. obtaining for each time segment k a selective sampling phase τs according to the following equation:

τs=τ avg (k)−tc(k)+ws(τmax (k)−τmin (k)−|tc(k)|)

(where, ws indicates the shift coefficient), h. obtaining for each time segment k a sample value sequence 𝑦={yn} (n=1, 2, . . . , N) by sampling the reception signal at the symbol interval T and the sampling phase τs, starting from the estimated leading time Et slot (k) of the time segment k, i. Processing a first part of the sample value sequence 𝑦 corresponding to the training sequence and a second part of the sample sequence 𝑦 other than the first part, including obtaining for each time segment k first estimated values E 𝗁={Ehj} (j=0, 1, . . . , L) of the impulse response of the transmission path from the first part of the sample value sequence 𝑦 and the training sequence φaccording to an adaptive equalization algorithm, and obtaining for each time segment k second estimated values E 𝗁 from the second part of the sample value sequence 𝑦 and estimated values E𝑥={Exn} (n=1, 2, . . . , N) of the transmission symbol sequence 𝑥, according to the adaptive equalization algorithm, and j. obtaining for each time segment k the estimated values E𝑥from the sample value sequence 𝑦 based on the first and second estimated values E 𝗁, according to the Viterbi algorithm.

28. A maximum likelihood sequence estimating method for estimating, from a reception signal y(t) received from a transmission path during each of a plurality of time segments designatable by an index k (k=1, 2, . . . ), a transmission symbol sequence 𝑥={xn} containing a predetermined training sequence φ={φn} (n=1, 2, . . . Nt), comprising the steps of:

a. during each of the time segments k sampling the reception signal y(t) at a symbol interval T at each of respective sampling phases of a sampling phase sequence τ={τ(i)} (i=1, 2, . . . , M), starting from an estimated leading time Et slot (k) of the time segment k determined by a frame synchronization mechanism, b. obtaining, for each time segment k from the sampling of said step a, sample value sequences 𝑦={yin} (i=1, 2, . . . , M; n=1, 2, . . . , Nt) of the reception signal y(t), c. obtaining for each time segment k a complex cross-correlation function 𝒸={Ci} (i=1, . . . , M) of the training sequence φand the sample value sequences 𝑦i, where Ci designates a complex cross-correlation correlation value corresponding to the complex cross-correlation of the sample value sequences 𝑦i and the training sequence, according to the following equation:

$$Ci = \sum_{j=1}^{Nt} yij(\phi j^*)$$

(where, i=1, 2, . . . , M; * means that complex conjugation is used), d. obtaining for each time segment k from among the sampling phases of the sampling phase sequence τ={τ(i)}, a sampling phase τsel (k), corresponding to the complex cross-correlation value Ci at which the absolute value of the cross-correlation function 𝒸={Ci} is maximum, by comparing the absolute values of the M number of complex cross-correlation values Ci, e. obtaining for each time segment k a first coordinate transformation term tc1 (k) and a second coordinate transformation term tc2 (j, k) according to the following equations, at the time of obtaining the sampling phase τsel (k):

$$\Delta tc(k) = \begin{cases} Et\,slot(k) - Et\,slot(k-1) & k > 1 \\ 0 & k \leq 1 \end{cases}$$

$$tc1(k) = \begin{cases} 0 & k \leq 1 \\ \sum_{i=1}^{k-1} \Delta tc(i+1) & 1 < k < Ls \\ \sum_{i=k-Ls}^{k-1} \Delta tc(i+1) & k \geq Ls \end{cases}$$

$$tc2(j,k) = \begin{cases} \sum_{i=j}^{k-1} \Delta tc(i+1) & j < k \\ 0 & j \geq k, \end{cases}$$

f. obtaining for each time segment k a sectional weighted mean value τ AVG (k), a sectional maximum value τ MAX (k) and a sectional minimum value τ MIN (k) of the sampling phase τsel (k), according to the following equations:

$$\tau MAX(k) = \begin{bmatrix} \max(\tau\, sel(j) + tc2(j,k)) & k < Ls \\ 1 \leq j \leq k \\ \max(\tau\, sel(j) + tc2(j,k)) & k \geq Ls \\ k - Ls + 1 \leq j \leq k \end{bmatrix}$$

$$\tau MIN(k) = \begin{bmatrix} \min(\tau\, sel(j) + tc2(j,k)) & k < Ls \\ 1 \leq j \leq k \\ \min(\tau\, sel(j) + tc2(j,k)) & k \geq Ls \\ k - Ls + 1 \leq j \leq k \end{bmatrix}$$

$$\tau AVG(k) =$$

$$\begin{bmatrix} \dfrac{\sum_{j=1}^{k} \{Wa(k-j+1)(\tau\, sel(k) + tc2(j,k))\}}{\sum_{j=1}^{Ls} Wa(j)} & k < Ls \\ \\ \dfrac{\sum_{j=k-Ls+1}^{k} \{Wa(k-j+1)(\tau\, sel(j) + tc2(j,k))\}}{\sum_{j=1}^{Ls} Wa(j)} & k \geq Ls \end{bmatrix}$$

(where, wa (j) (j=1, 2, . . . , Ls ) is a weighting coefficient and Ls denotes the maximum calculation length), g. obtaining for each time segment k a selective sampling phase τs according to the following equation:

$$\tau s = \tau AVG\,(k) + ws\,(\tau MAX\,(k) - \tau MIN\,(k) - |tc1\,(k)|)$$

(where, ws indicates the shift coefficient), h. obtaining for each time segment k a sample value sequence $y=\{yn\}$ (n=1, 2, . . . , N) by sampling the reception signal at the symbol interval T and the selective sampling phase τs, starting from the estimated leading time Et slot (k), i. processing a first part of the sample value sequence $y$ corresponding to the training sequence and a second part of the sample sequence $y$ other than the first part, including obtaining for each time segment k first estimated values $E_h=\{Ehj\}$ (j=0, 1, . . . , L) of the impulse response of the transmission path from the first part of the sample value sequence $y$ and the training sequence $\phi$ corresponding according to an adaptive equalization algorithm, and obtaining for each time segment k second estimated values $E_h$ from the second part of the sample value sequence y and estimated values $E_x=\{Exn\}$ (n=1, 2, . . . , N) of the transmission symbol sequence $x$, according to the adaptive equalization algorithm, and j. obtaining for each time segment k the estimated values $E_x$ from the sample value sequence $y$ based on the first and second estimated values $E_h$, according to the Viterbi algorithm.

29. A method of estimating, from a reception signal y(t) received from a transmission path during each of a plurality of time segments designatable by an index k (k=1, 2, . . . ), a transmission symbol sequence $x=\{xn\}$ (n=1, 2, . . . , N) containing a predetermined training sequence $\phi=\{\phi n\}$ (n=1, 2, . . . , Nt; Nt<N), the method comprising the steps of:

a. during each of the time segments k (k=1, 2, . . . ), sampling the reception signal y(t) at a symbol interval T over a time period Nt·T corresponding to the training sequence $\phi$ of the transmission symbol sequence $x$, at each of a plurality of sampling phases τ (i) of a sampling phase sequence $\tau=\{\tau(i)\}$ (i=1, 2, . . . , M) relative to an estimated starting time Et slot (k) of the time segment k, to obtain for the time segment k, a plurality of sample value sequences $yi=\{yin\}$ (n=1, 2, . . . , Nt) corresponding to the respective sampling phases $\tau(i)$, (i=1, 2, . . . , M), the sample value sequences $yi$ corresponding to the training sequence $\phi$ of the transmission symbol sequence $x$;

b. obtaining for each time segment k a complex cross-correlation function $c=\{Ci\}$ comprised of cross-correlation values Ci (i=1, 2, . . . , M), the values Ci being obtained by cross-correlating the sample value sequences $yi$ and the training sequence $\phi$;

c. obtaining for each time segment k from among the sampling phases of the sampling phase sequence $\tau=\{\tau(i)\}$ a selected sampling phase, corresponding to the complex cross-correlation value Ci obtained in said step b for the time segment k, at which the absolute value of the cross-correlation function $c=\{Ci\}$ is maximum, by comparing the absolute values of the M number of complex cross-correlation values Ci;

d. obtaining for each time segment k a sampling phase τs based on a plurality of the selected sampling phases obtained in said step c for different ones of the time segments;

e. sampling the reception signal y(t) during each time segment k at specified timings with respect to the symbol interval T and the sampling phase τs to obtain a sample value sequence $y=\{yn\}$ (n=1, 2, . . . , N);

f. obtaining for each time segment k estimated values $E_h=\{Ehj\}$ (j=0, 1, . . . , L) of the impulse response of the transmission path based on the sample value sequence $y$; and g. obtaining for each time segment k estimated values $E_x=\{Exn\}$ (n=1, 2, . . . , N) of the transmission symbol sequence $x=\{xn\}$ from the sample value sequence $y$ based on the estimated values $E_h$.

30. A maximum likelihood sequence estimating method as set forth in claim 29, wherein the time segments k are successive non-overlapping time segments and the said step d includes obtaining the sampling phase τs for each time segment k based on the selected sampling phase obtained in said step c for the same time segment k and at least one of the selected sampling phases obtained in said step c for the time segments prior to said same time segment k.

31. A maximum likelihood sequence estimating method as set forth in claim 29, wherein said step f includes processing a first part of the sample value sequence $y$ corresponding to the training sequence and a second part of the sample sequence $y$ other than the first part, so as to obtain for each time segment k first estimated values $E_h=\{Ehj\}$ (j=0, 1, . . . , L) of the impulse response of the transmission path from the first part of the sample value sequence $y$ and the training sequence $\phi$ according to an adaptive equalization algorithm, and obtain for each time segment k second estimated values $E_h$ from the second part of the sample value sequence $y$ and estimated values $E_x=\{Exn\}$ (n=1, 2, . . . , N) of the transmission symbol sequence $x$, according to the adaptive equalization algorithm.

32. A maximum likelihood sequence estimator as set forth in claim 9, wherein said sampling phase smoothing means obtains for each time segment k, k≧Ls, where Ls is a predetermined maximum calculation length, the sectional weighted mean value, the sectional maximum value and the sectional minimum value, all of the selected sampling phase τsel (k), based on the values of the selected sampling phases τsel (j), K–Ls≦j≦k.

* * * * *